(12) United States Patent
Guo et al.

(10) Patent No.: US 12,080,819 B2
(45) Date of Patent: Sep. 3, 2024

(54) SOLAR CELL AND PHOTOVOLTAIC MODULE

(71) Applicant: ZHEJIANG JINKO SOLAR CO., LTD., Zhejiang (CN)

(72) Inventors: Zhiqiu Guo, Zhejiang (CN); Shiliang Huang, Zhejiang (CN); Yingli Guan, Zhejiang (CN)

(73) Assignee: ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 18/059,408

(22) Filed: Nov. 28, 2022

(65) Prior Publication Data

US 2024/0136455 A1 Apr. 25, 2024
US 2024/0234605 A9 Jul. 11, 2024

(30) Foreign Application Priority Data

Oct. 24, 2022 (CN) .......................... 202211298934.9
Oct. 24, 2022 (CN) .......................... 202211298941.9

(51) Int. Cl.
*H01L 31/05* (2014.01)
*H01L 31/048* (2014.01)
(Continued)

(52) U.S. Cl.
CPC ............ *H01L 31/05* (2013.01); *H01L 31/048* (2013.01); *H01L 31/022425* (2013.01);
(Continued)

(58) Field of Classification Search
CPC .................. H01L 31/05; H01L 31/048; H01L 31/022425; H01L 31/022433;
(Continued)

(56) References Cited

U.S. PATENT DOCUMENTS 9,054,238 B1 6/2015 Brainard et al.
10,879,411 B2 12/2020 Oh et al.
(Continued)

FOREIGN PATENT DOCUMENTS

CN 103378180 A 10/2013
CN 108074996 A 5/2018
(Continued)

OTHER PUBLICATIONS

Zhejiang Jinko Solar Co., Ltd., Extended European Search Report, EP 22210924.1, Aug. 21, 2023, 4 pgs.
(Continued)

*Primary Examiner* — Michael Y Sun
(74) *Attorney, Agent, or Firm* — USCH Law, PC

(57) ABSTRACT

A solar cell and a photovoltaic module are provided. The solar cell includes a substrate having first edges and second edges; two first main electrodes, where each first main electrode is close to a corresponding first edge and includes a plurality of first sub-connection pads and a first connection wire; and at least two second main electrodes, where the at least two second main electrodes are disposed between the two first main electrodes, where each of the at least two second main electrodes includes a plurality of second sub-connection pads and a second connection wire, where a first pitch between a respective first main electrode and a second main electrode adjacent to the respective first main electrode is not equal to a second pitch between adjacent second main electrodes.

19 Claims, 7 Drawing Sheets

(51) Int. Cl.
    *H01L 31/0224* (2006.01)
    *H01L 31/0465* (2014.01)
    *H01L 31/18* (2006.01)
(52) U.S. Cl.
    CPC .. *H01L 31/022433* (2013.01); *H01L 31/0465* (2014.12); *H01L 31/0504* (2013.01); *H01L 31/1868* (2013.01); *Y02E 10/50* (2013.01)
(58) Field of Classification Search
    CPC ............ H01L 31/0465; H01L 31/0504; H01L 31/1868; Y02E 10/50
    See application file for complete search history.

(56) References Cited

U.S. PATENT DOCUMENTS

| | | |
|---|---|---|
| 2013/0220411 A1 | 8/2013 | Lee et al. |
| 2016/0005905 A1 | 1/2016 | Jang et al. |
| 2016/0093752 A1 | 3/2016 | Kim et al. |
| 2018/0090633 A1* | 3/2018 | Cho ................ H01L 31/0465 |
| 2018/0138324 A1* | 5/2018 | Jin ................... H01L 31/0508 |
| 2019/0074391 A1 | 3/2019 | Yoon et al. |
| 2020/0075788 A1 | 3/2020 | Oh et al. |

FOREIGN PATENT DOCUMENTS

| | | |
|---|---|---|
| CN | 209000922 U | 6/2019 |
| CN | 110112231 A | 8/2019 |
| CN | 209526094 U | 10/2019 |
| CN | 209691761 U | 11/2019 |
| CN | 210897297 U | 6/2020 |
| CN | 211828804 U | 10/2020 |
| CN | 212136463 U | 12/2020 |
| CN | 212783473 U | 3/2021 |
| CN | 112768546 A | 5/2021 |
| CN | 113690333 A | 11/2021 |
| CN | 114242810 A | 3/2022 |
| CN | 114765225 A | 7/2022 |
| CN | 115148839 A | 10/2022 |
| CN | 217588948 U | 10/2022 |
| EP | 3300123 A1 | 3/2018 |
| EP | 3416196 A1 | 12/2018 |
| FR | 3088139 A1 | 5/2020 |
| JP | H0669524 A | 3/1994 |
| JP | 2004140024 A | 5/2004 |
| JP | 2008135655 A | 6/2008 |
| JP | 2010093188 A | 4/2010 |
| JP | 2010177655 A | 8/2010 |
| JP | 2010262979 A | 11/2010 |
| JP | 2016189458 A | 11/2016 |
| JP | 2017147472 A | 8/2017 |
| JP | 2018056563 A | 4/2018 |
| JP | 7137031 B1 | 3/2023 |
| WO | 2013039158 A1 | 3/2013 |
| WO | 2017128657 A1 | 8/2017 |
| WO | 2020237854 A1 | 12/2020 |
| WO | 2022143352 A1 | 7/2022 |

OTHER PUBLICATIONS

Zhejiang Jinko Solar Co., Ltd., Notice of acceptance for your patent application, AU 2022279534, Nov. 24, 2023, 4 pgs.

* cited by examiner

SOLAR CELL AND PHOTOVOLTAIC MODULE

CROSS REFERENCE TO RELATED APPLICATIONS

The present application claims the benefit of priority under the Paris Convention to Chinese Patent Application No. 202211298934.9 filed on Oct. 24, 2022, and to Chinese Patent Application No. 202211298941.9 filed on Oct. 24, 2022, each of which is incorporated herein by reference in its entirety.

TECHNICAL FIELD

The disclosure relates to the photovoltaic field, and more specifically to a solar cell and a photovoltaic module.

BACKGROUND

Performance (such as photoelectric conversion efficiency) of solar cells is affected by optical loss and electrical loss. The optical loss includes reflection loss of a front surface of the solar cell, shadow loss of contact grid lines, and non-absorption loss in longwave band, and the like. The electrical loss includes photo-generated carrier recombination on the surface and in body of the semiconductor, and loss of contact resistance between the semiconductor and the metal grid lines, and the like.

Current generated by the solar cell is collected and output through secondary grid lines and main grid lines arranged in the solar cell, and then is transmitted to an assembly end through pad sections arranged on the main grid lines. However, the solar cell has relatively weak current collection ability in the related technologies, which may affect improvement of the photoelectric conversion efficiency of the solar cell.

SUMMARY

Embodiments of the disclosure provide a solar cell and a photovoltaic module.

According to some embodiments, a solar cell is provided. The solar cell includes a substrate having first edges and second edges, where the first edges include two opposite edges of the substrate along a second direction and the second edges include two opposite edges of the substrate along a first direction; a passivation layer disposed on the substrate; a plurality of secondary electrodes arranged at intervals along the second direction on the substrate, where each of the plurality of secondary electrodes extends along the first direction, and penetrates through the passivation layer to be in contact with the substrate; two first main electrodes, disposed on a surface of the passivation layer, where each of the two first main electrodes is close to a corresponding first edge and includes a plurality of first sub-connection pads arranged at intervals along the second direction and a first connection wire, and the first connection wire is in contact with a side of each of at least one of the plurality of first sub-connection pads close to the corresponding first edge; and at least two second main electrodes, where the at least two second main electrodes are disposed on the surface of the passivation layer, and are disposed between the two first main electrodes, where each of the at least two second main electrodes includes a plurality of second sub-connection pads arranged at intervals along the second direction and a second connection wire, and the second connection wire is in contact with at least one of the plurality of second sub-connection pads, where a first pitch between a respective first main electrode and a second main electrode adjacent to the respective first main electrode is not equal to a second pitch between adjacent second main electrodes.

In some embodiments, in the first direction, each of at least one of the plurality of secondary electrodes is in contact with a side of a corresponding first sub-connection pad away from the corresponding first edge.

In some embodiments, the first pitch is greater than the second pitch.

In some embodiments, the first pitch is less than the second pitch.

In some embodiments, a chamfer is provided at a junction of a respective first edge and a corresponding second edge, each of the two first main electrodes is adjacent to a corresponding pair of chamfers; and in the second direction, at least one of a first of the plurality of first sub-connection pads and a last of the plurality of first sub-connection pads is located in an edge region outside a corresponding chamfer along the second direction.

In some embodiments, the first connection wire includes a first connection section close to an outside of each of the corresponding pair of chamfers in the first direction and a second connection section connected to the first connection section; wherein the first connection section has a cross-sectional area larger than a cross-sectional area of the second connection section.

In some embodiments, in the second direction, a distance between an end of the first of the plurality of first sub-connection pads close to an adjacent second edge and an edge of an adjacent chamfer facing the first sub-connection pads along the second direction is less than or equal to a grid pitch between adjacent secondary electrodes.

In some embodiments, in the second direction, a first distance between a first of the plurality of first sub-connection pads and an adjacent second edge is greater than a second distance between a first of the plurality of second sub-connection pads and the adjacent second edge in the second direction.

In some embodiments, an area of each of the plurality of first sub-connection pads is larger than an area of any of the plurality of second sub-connection pads.

In some embodiments, in the first direction, for a respective secondary electrode of the plurality of secondary electrodes, a cross-sectional area of a part of the respective secondary electrode close to the first edge is larger than a cross-sectional area of another part of the respective secondary electrode away from the first edge.

In some embodiments, the plurality of first sub-connection pads comprise two first sub-connection disks respectively close to the second edges and at least one second sub-connection disk disposed between the two first sub-connection disks; and a first cross-sectional area of a first part of the first connection wire between a respective first sub-connection disk and a second edge adjacent to the respective first sub-connection pad is larger than a second cross-sectional area of a second part of the first connection wire between the two first sub-connection disks.

In some embodiments, a difference between the first cross-sectional area and the second cross-sectional area is proportional to a spacing between the respective first sub-connection disk and the second edge adjacent to the respective first sub-connection disk.

In some embodiments, a first width of the first part of the first connection wire between the respective first sub-connection disk and the second edge adjacent to the respective first sub-connection disk is larger than a second width of the second part of the first connection wire between the two first sub-connection disks.

In some embodiments, for a same first main electrode, a third cross-sectional area of a third part of the first connection wire between two adjacent second sub-connection disks is a smallest cross-sectional area.

In some embodiments, a fourth cross-sectional area of a fourth part of the first connection wire between the respective first sub-connection disk and a second sub-connection disk adjacent to the respective first sub-connection disk is greater than or equal to the third cross-sectional area.

In some embodiments, an area of each of the two first sub-connection disks is larger than an area of any of the at least one second sub-connection disk.

In some embodiments, the first connection wire is closed at each port of ports respectively close to the second edges, and the second connection wire is closed at each port of ports respectively close to the second edges, wherein a sectional area of the first connection wire is larger than or equal to a sectional area of the second connection wire.

In some embodiments, the solar cell is a back contact cell, and the plurality of secondary electrodes comprises first electrodes and second electrodes alternatively arranged along the second direction, wherein at least two second main electrodes comprise first grid line structures and second grid line structures alternatively arranged; wherein each of the first grid line structures is electrically connected with the first electrodes, and each of the second grid line structures is electrically connected with the second electrodes.

In some embodiments, the first grid line structures and the second grid line structures are misaligned along the first direction.

Embodiments of the disclosure further provide a photovoltaic module. The photovoltaic module includes at least one cell string each including a plurality of solar cells, at least one encapsulating layer, and at least one cover plate. Each of the plurality of solar cells being a solar cell provided in any of the above embodiments. Each encapsulating layer is configured to cover a surface of the at least one cell string. Each cover plate is configured to cover a surface of a corresponding encapsulating layer of the at least one encapsulating layer facing away from the at least one cell string.

BRIEF DESCRIPTION OF THE DRAWINGS

One or more embodiments are described as examples with reference to the corresponding figures in the accompanying drawings and the exemplary illustration does not constitute a limitation to the embodiments. Unless otherwise stated, the figures in the accompanying drawings do not constitute a proportion limitation. In order to more clearly explain that embodiments of the disclosure or technical solutions in the conventional technique, the drawings required for use in the embodiments will be briefly described below, and it will be apparent that the drawings described below are only some of the embodiments of the disclosure, from which other drawings may be obtained without creative effort by a person of ordinary skill in the art.

DETAILED DESCRIPTION OF THE EMBODIMENTS

Figure 1:
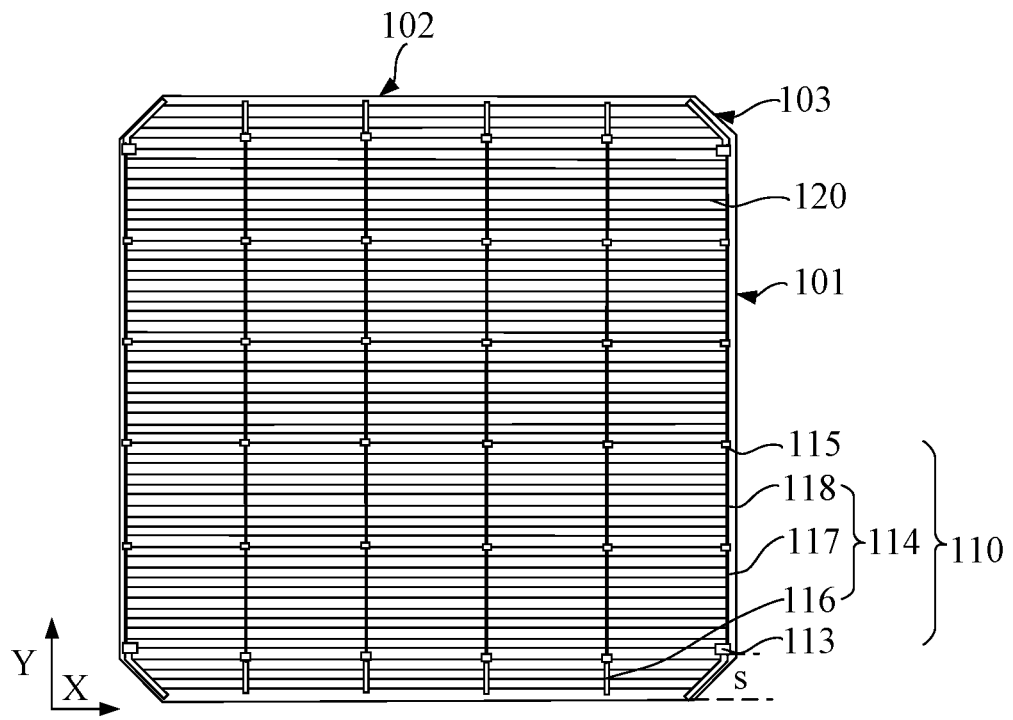
FIG. 1 is a schematic structural view illustrating a solar cell according to embodiments of the disclosure.

In view of the above, solar cells have relatively poor photoelectric conversion efficiency in related technologies.

The analysis found that one of reasons for poor photoelectric conversion efficiency of the solar cells in the related technologies is that: in conventional solar cells, due to refining limitation of monocrystalline silicon process for preparing a substrate, only round monocrystalline silicon rods can be made at present, and after the silicon rod is obtained, the silicon rod is sliced. That is, the silicon rod is cut into a monocrystalline silicon wafer (after an area of the monocrystalline silicon wafer is obtained by calculating, an illumination area can be maximized in one unit, a silicon rod material can be saved to the maximum extent, and production of solar cells and components is convenient). A chamfer is generally provided at a junction of a respective first edge and a corresponding second edge of the substrate to reduce external stress of the silicon wafer and avoid micro-damage to corners of the silicon wafer. In addition, to ensure that welding strips (welding belts) do not exceed the chamfers of the solar cell during welding, there is a need to reserve a certain distance between the welding joint and the chamfer of the solar cell, which may make a carrier transmission path in a chamfer region too long and lead to an increased transport loss. Furthermore, if the welding joint or the welding strip is close to an edge of the solar cell, the solar cell may crack during subsequent lamination, which may affect the performance of the solar cell.

Embodiments of the disclosure provide a solar cell. The solar cell includes a substrate having first edges and second edges, where the first edges include two opposite edges of the substrate along a second direction and the second edges include two opposite edges of the substrate along a first direction; a passivation layer disposed on the substrate; a plurality of secondary electrodes arranged at intervals along the second direction on the substrate, where each of the plurality of secondary electrodes extends along the first direction, and penetrates through the passivation layer to be in contact with the substrate; and at least one main electrode located on a surface of the passivation layer, where each of the at least one main electrode includes two connection pads respectively close to the second edges; a connection wire, where each port of ports of the connection wire near a corresponding second edge is closed, and a surface of a portion of the connection wire other than the ports is in contact with each connection pad. A first cross-sectional area of a part of the connection wire between a respective connection pad and a second edge adjacent to the respective connection pad is larger than a second cross-sectional area of another part of the connection wire between the two connection pads.

In some embodiments, a difference between the first cross-sectional area and the second cross-sectional area is proportional to a spacing between the respective connection pad and the second edge adjacent to the respective connection pad.

In some embodiments, a first width of the part of the connection wire between the respective connection pad and the second edge adjacent to the respective connection pad is larger than a second width of the another part of the connection wire between the two connection pads.

In some embodiments, each of the at least one main electrode further includes at least one second connection pad, and the at least one second connection pad is located between the two connection pads. The connection wire is in contact with each second connection pad. For a same main electrode, a third cross-sectional area of a part of the connection wire between two adjacent second connection pads is a smallest cross-sectional area.

In some embodiments, a fourth cross-sectional area of a part of the connection wire between the respective connection pad and a second connection pad adjacent to the respective connection pad is larger than or equal to the third cross-sectional area.

In some embodiments, an area of each of the two connection pads is larger than an area of any of the at least one second connection pad.

In some embodiments, the at least one main electrode includes two first main electrodes and at least one second main electrode. Each of the two first main electrodes is close to a corresponding first edge, and the at least one second main electrode is disposed between the two first main electrodes. The at least one second main electrode is located on the surface of the passivation layer.

In some embodiments, each of the two first main electrodes includes two first sub-connection pads respectively close to the second edges, and a first connection wire. Each port of ports of the first connection wire near the corresponding second edge is closed, and a surface of a portion of the first connection wire other than the ports is in contact with each of the two first sub-connection pads. A fifth cross-sectional area of a part of the first connection wire between a respective first sub-connection pad and a second edge adjacent to the respective first sub-connection pad is larger than a sixth cross-sectional area of another part of the first connection wire between the two first sub-connection pads.

In some embodiments, each of the at least one second main electrode includes a second connection wire. The second connection wire is closed at each port of ports respectively close to the second edges. A cross-sectional area of the first connection wire is larger than or equal to a cross-sectional area of the second connection wire.

In some embodiments, each of the at least one second main electrode further includes second sub-connection pads, where the second sub-connection pads are respectively close to the second edges. The second sub-connection pads are in contact with the second connection wire. In the second direction, a first distance between the respective first sub-connection pad and the second edge adjacent to the respective first sub-connection pad is greater than a second distance between a respective second sub-connection pad and a second edge adjacent to the respective second sub-connection pad.

In some embodiments, a chamfer is provided at a junction of a respective first edge and a corresponding second edge, each of the two first main electrodes is adjacent to a corresponding pair of chamfers, and in the second direction, each of the two first sub-connection pads is located in an edge region outside a corresponding chamfer along the second direction.

In some embodiments, the solar cell is a back contact cell, and the plurality of secondary electrodes include first electrodes and second electrodes alternatively arranged along the second direction. The at least one main electrode includes first grid line structures and second grid line structures alternatively arranged. Each of the first grid line structures is electrically connected with the first electrodes, and each of the second grid line structures is electrically connected with the second electrodes.

In some embodiments, the first grid line structures and the second grid line structures are misaligned in the first direction.

In some embodiments, in the first direction, for a respective secondary electrode of the plurality of secondary electrodes, a cross-sectional area of a part of the respective secondary electrode close to the first edge is larger than a cross-sectional area of another part of the respective secondary electrode away from the first edge.

According to the solar cell provided in embodiments of the disclosure, each main electrode includes two connection pads and the connection wire. By arranging the relatively thin connection wire, an effective light shielding area can be reduced, and the resistance loss can be reduced, thereby improving a module total power. In addition, since connection wires forming the main grid lines are densely distributed, more contact points between the main grid lines and the secondary grid lines are obtained, and a current conduction path at cracked and micro-cracked parts of the silicon wafer is more optimized, so the loss caused by micro-cracks is greatly reduced, which is beneficial to improving the output of the production line. In addition, the first cross-sectional area of the part of the connection wire between the respective connection pad and the adjacent second edge is larger than the second cross-sectional area of the another part of the connection wire between the two connection pads, i.e., the width of the part of the connection wire between the connection pad and the adjacent second edge is larger, so that the welding stress of the connection pad can be relieved to form a good contact between the welding strip and the main electrode. Furthermore, the relatively wide connection line can relieve the collection pressure of the connection pad and improve the carrier transmission capacity, and the relatively wide connection line has more transmission area for current collection.

Embodiments of the disclosure further provide a solar cell. The solar cell includes a substrate having first edges and second edges, where the first edges include two opposite edges of the substrate along a second direction and the second edges include two opposite edges of the substrate along a first direction; a passivation layer disposed on the substrate; a plurality of secondary electrodes arranged at intervals along the second direction on the substrate, where each of the plurality of secondary electrodes extends along the first direction, and penetrates through the passivation layer to be in contact with the substrate; two first main electrodes, located on a surface of the passivation layer, where each of the two first main electrodes is close to a corresponding first edge and includes a plurality of first sub-connection pads arranged at intervals along the second direction and a first connection wire, and the first connection wire is in contact with a side of each of at least one of the plurality of first sub-connection pads close to the corresponding first edge; and at least two second main electrodes, where the at least two second main electrodes are located on the surface of the passivation layer, and are located between the two first main electrodes. Each second main electrode of the at least two second main electrodes includes a plurality of second sub-connection pads arranged at intervals along the second direction and a second connection wire. The second connection wire is in contact with at least one of the plurality of second sub-connection pads. A first pitch between a respective first main electrode and a second main electrode adjacent to the respective first main electrode is not equal to a second pitch between two adjacent second main electrodes.

In some embodiments, in the first direction, each secondary electrode of at least one secondary electrode of the plurality of secondary electrodes is in contact with a side of a corresponding first sub-connection pad away from the corresponding first edge.

In some embodiments, the first pitch is greater than the second pitch.

In some embodiments, the first pitch is less than the second pitch.

In some embodiments, a chamfer is provided at a junction of a respective first edge and a corresponding second edge, and each of the two first main electrodes is adjacent to corresponding chamfers. In the second direction, at least one of the first of the plurality of first sub-connection pads and the last of the plurality of first sub-connection pads is located in an edge region outside a corresponding chamfer along the second direction.

In some embodiments, each first connection wire includes a first connection section close to an outside of each of corresponding chamfers in the first direction and a second connection section connected to the first connection section. The first connection section has a cross-sectional area larger than a cross-sectional area of the second connection section.

In some embodiments, in the second direction, a distance between an end of the first of the plurality of first sub-connection pads close to an adjacent second edge and an edge of an adjacent chamfer facing the first sub-connection pads along the second direction is less than or equal to a grid pitch between adjacent secondary electrodes.

In some embodiments, in the second direction, a first distance between the first of the plurality of first sub-connection pads and an adjacent second edge is greater than a second distance between the first of the plurality of second sub-connection pads and the adjacent second edge in the second direction.

In some embodiments, an area of each of the plurality of first sub-connection pads is larger than an area of any of the plurality of second sub-connection pads.

In some embodiments, in the first direction, for a respective secondary electrode of the plurality of secondary electrodes, a cross-sectional area of a part of the secondary electrode close to the first edge is larger than a cross-sectional area of another part of the secondary electrode away from the first edge.

According to the solar cell provided in embodiments of the disclosure, each first main electrode includes the first sub-connection pads and the first connection wire, and each second main electrode includes the second sub-connection pads and the second connection wire. By arranging the relatively thin first connection wires and the second connection wires, an effective light shielding area and the resistance loss can be reduced, thereby improving the module total power. In addition, since the first connection wires and the second connection wires forming the main grid lines are densely distributed, more contact points between the main grid lines and the secondary grid lines can be obtained, and a current conduction path at the cracked and micro-cracked parts of the silicon wafer is more optimized, so the loss caused by micro-cracks is greatly reduced, which is beneficial to improving the output of the production line. Each first connection wire is in contact with a side of each of the at least one first sub-connection pad close to the first edge, i.e., the first connection wire is closer to the first edge, such that the ability of the first connection wire to collect the current at the first edge is enhanced. In addition, at least one width of the first connection wire is separated between the first sub-connection pad and the first edge, so that the damage caused by poor stress at the edge can be avoided during welding and laminating. In addition, the first pitch between the respective first main electrode and the adjacent second main electrode is not equal to the second pitch between the adjacent second main electrodes. For example, the first pitch is greater than the second pitch, the first main electrode is close to the first edge, and the main electrodes at the edge are sparsely arranged, so that the risk of micro-cracking of the solar cell can be avoided during welding and laminating. Alternatively, the first pitch is smaller than the second pitch, such that the first main electrode and the second main electrode at the edge are densely distributed, and a path of current from the secondary electrode to the main electrode is relatively short, thereby reducing loss and facilitating the ability of the electrode to collect current at the edge.

The embodiments of the disclosure will be described in detail below with reference to the accompanying drawings. However, those of ordinary skill in the art can understand that, in various embodiments of the disclosure, many technical details are set forth in order to provide the reader with a better understanding of the disclosure. However, the technical solutions claimed in the disclosure may be realized even without these technical details and various changes and modifications based on the following embodiments.

Figure 2:
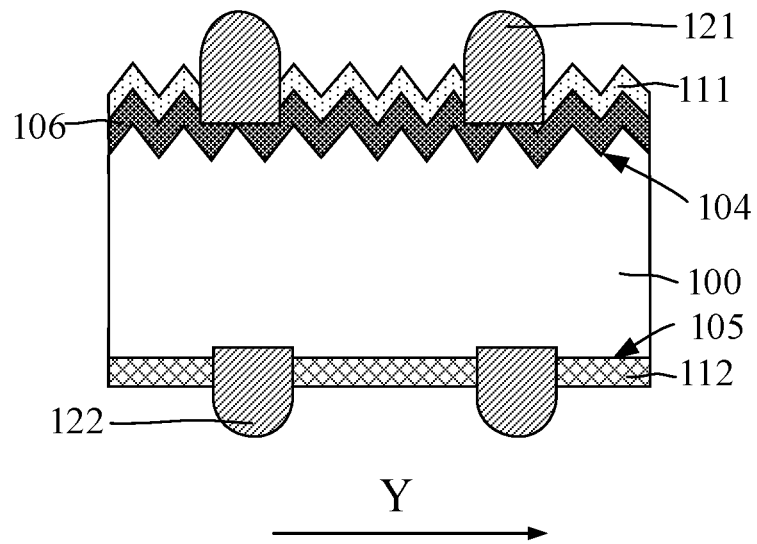
FIG. 2 is a partial structural view illustrating a solar cell according to embodiments of the disclosure.
Figure 3A:
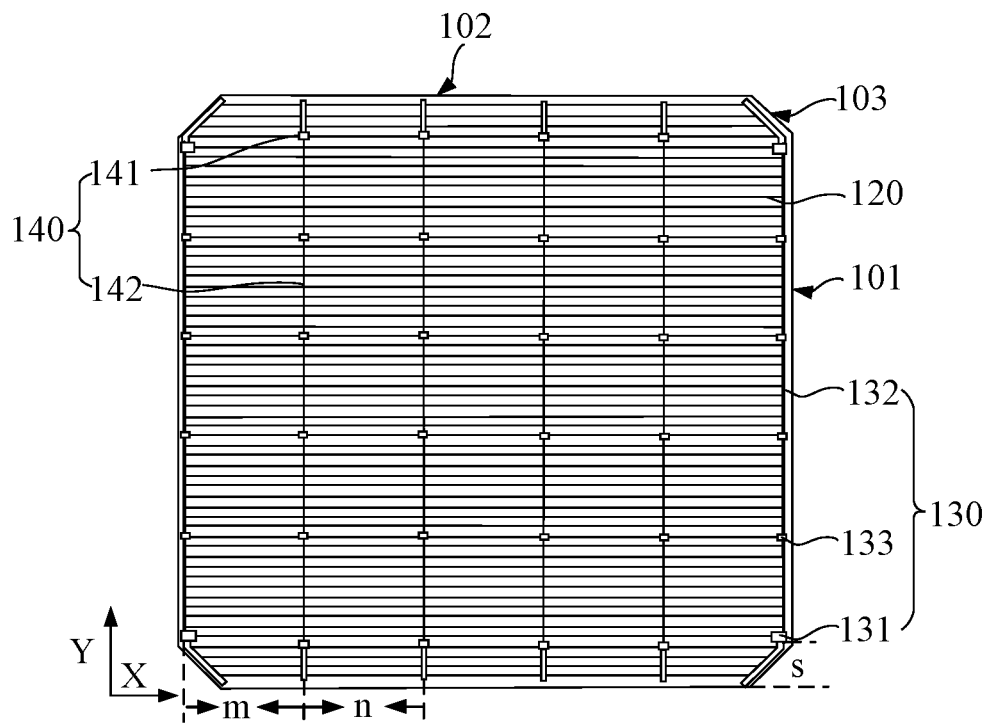
FIG. 3A is a schematic structural view illustrating a solar cell according to other embodiments of the disclosure.
Figure 3B:
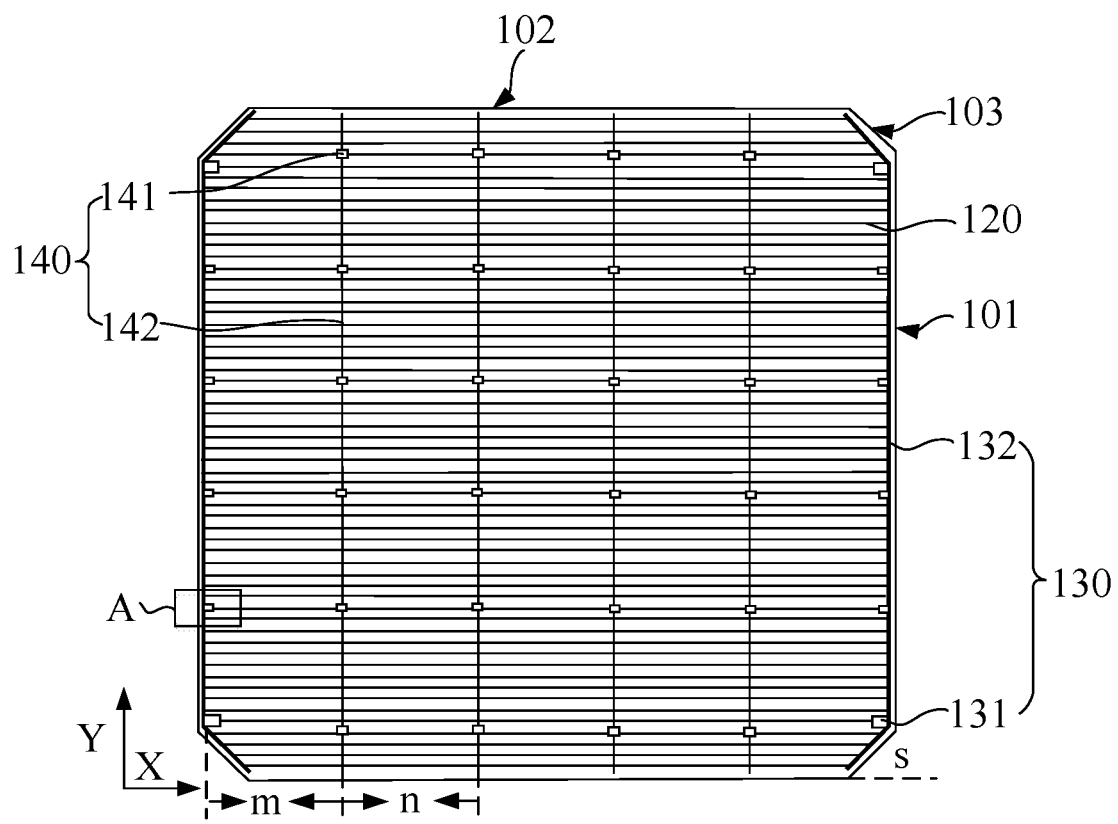
FIG. 3B is a schematic structural view illustrating a solar cell according to other embodiments of the disclosure.
Figure 4:
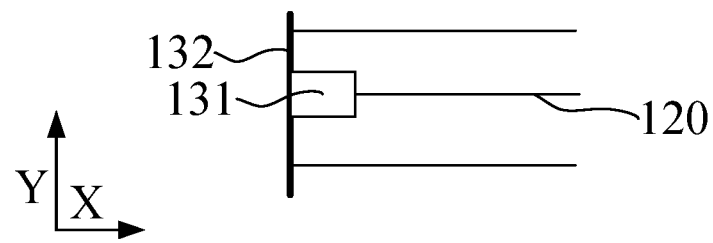
FIG. 4 is an enlarged partial view of part A in FIG. 3B.
Figure 5:
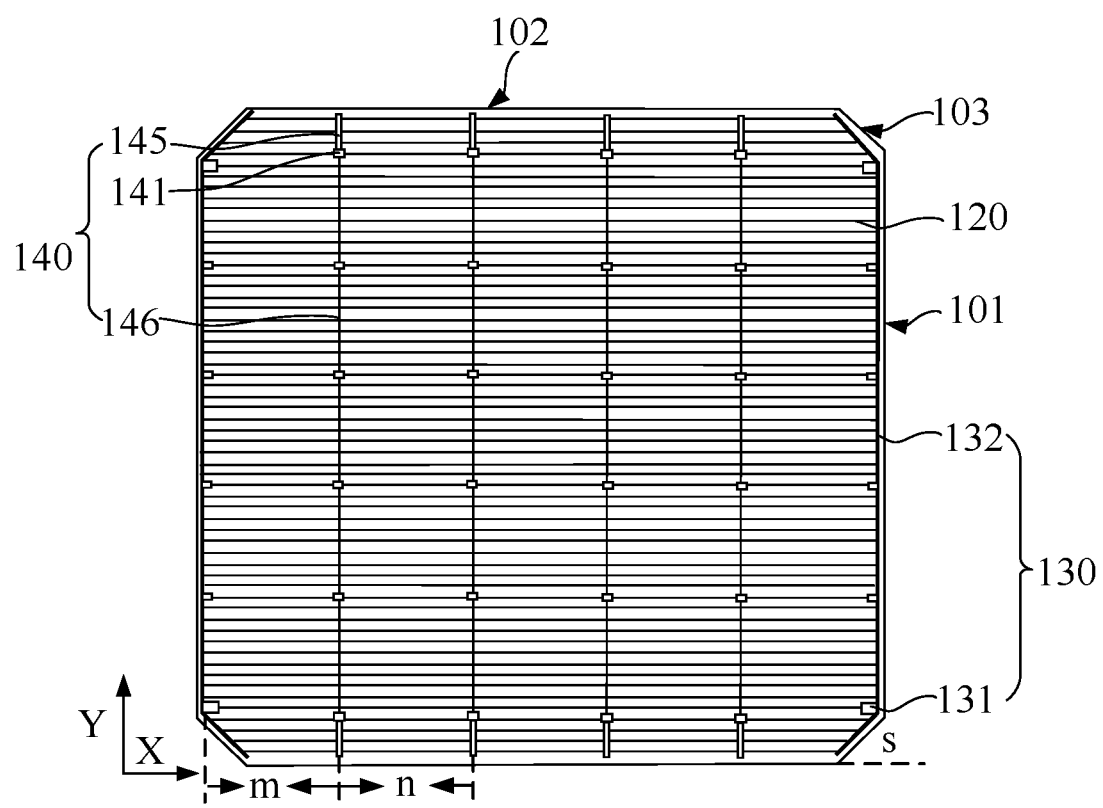
FIG. 5 is a schematic structural view illustrating a solar cell according to other embodiments of the disclosure.
Figure 6:
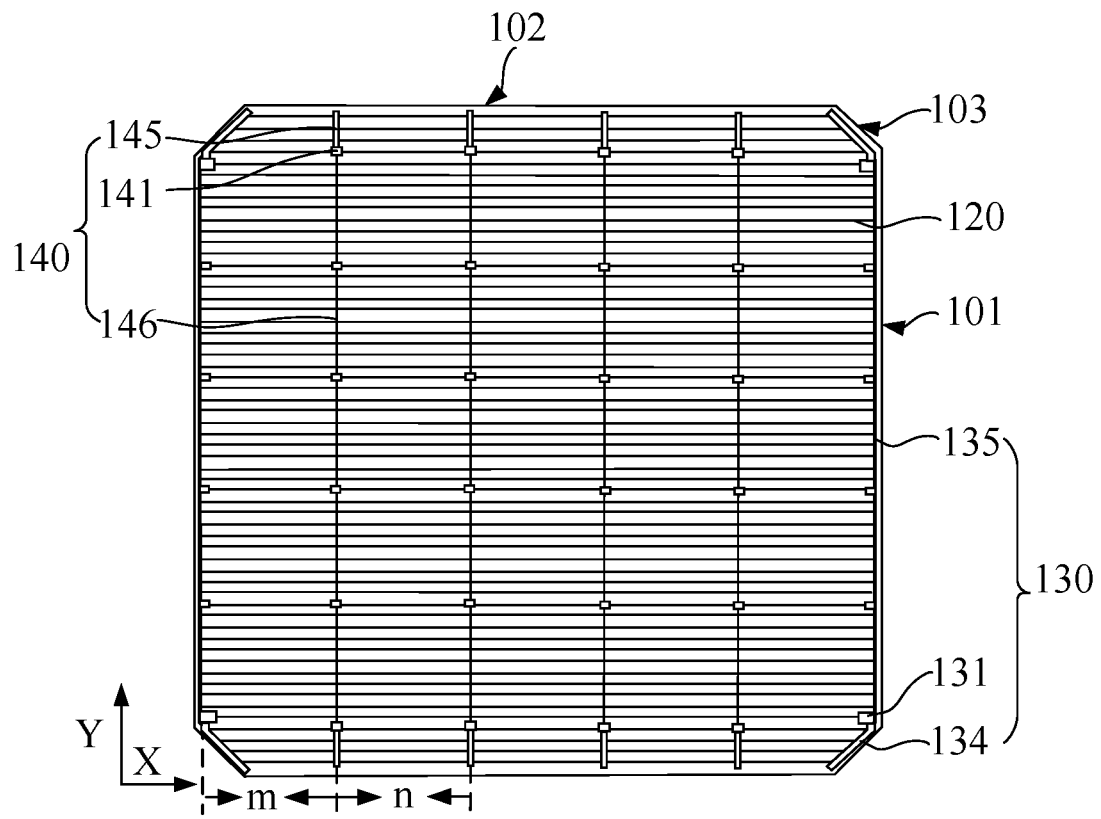
FIG. 6 is a schematic structural view illustrating a solar cell according to other embodiments of the disclosure.
Figure 7:
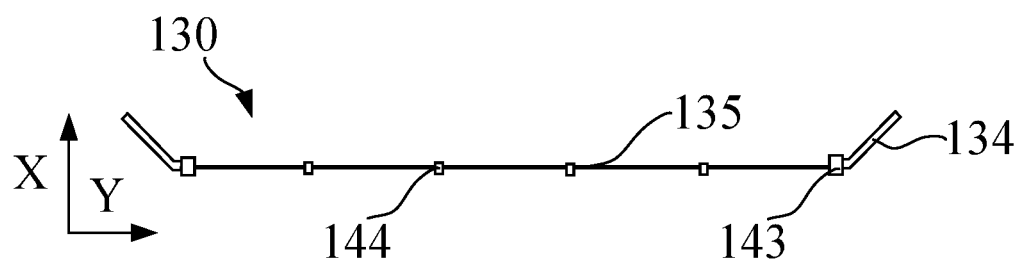
FIG. 7 is a schematic structural view illustrating a first main electrode in a solar cell according to embodiments of the disclosure.
Figure 8:
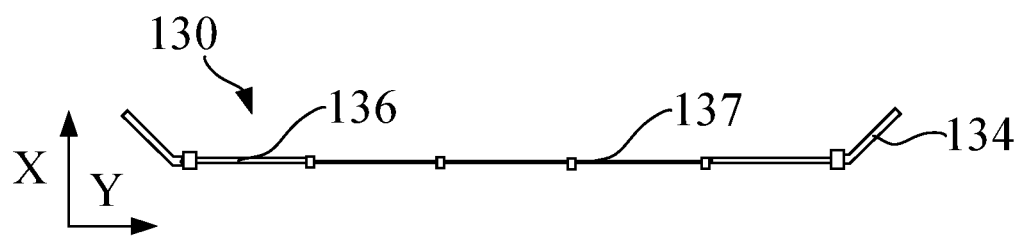
FIG. 8 is a schematic structural view illustrating a first main electrode in a solar cell according to other embodiments of the disclosure.
Figure 9:
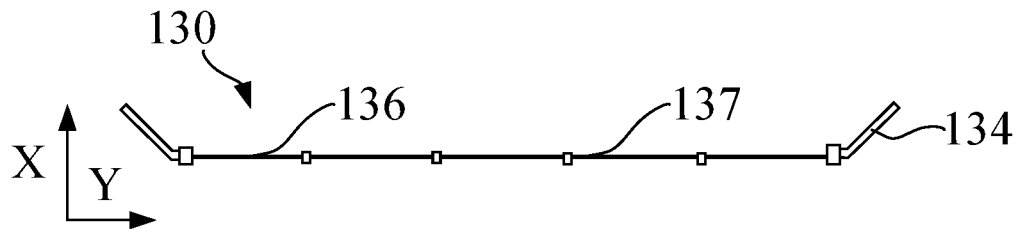
FIG. 9 is a schematic structural view illustrating a first main electrode in a solar cell according to other embodiments of the disclosure.
Figure 10:
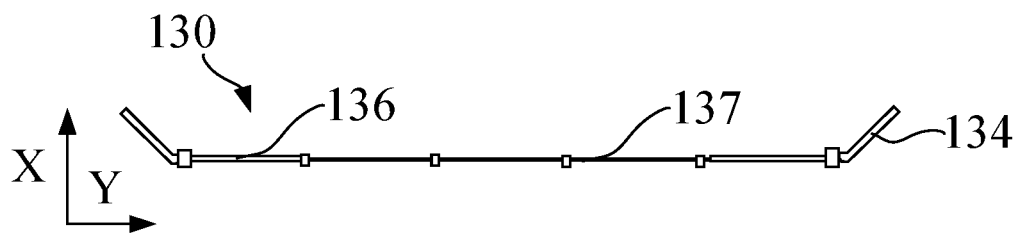
FIG. 10 is a schematic structural view illustrating a first main electrode in a solar cell according to other embodiments of the disclosure.
Figure 11:
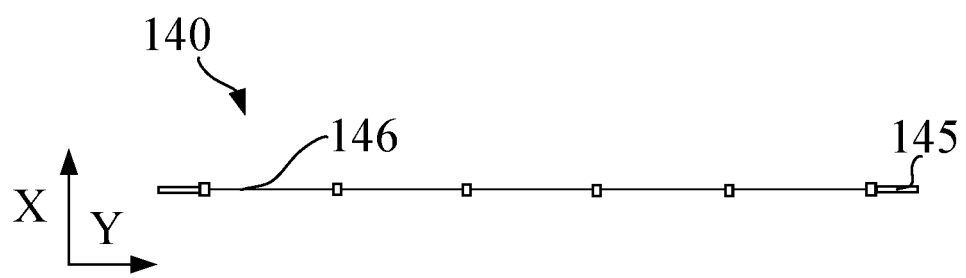
FIG. 11 is a schematic structural view illustrating a second main electrode in a solar cell according to embodiments of the disclosure.
Figure 12:
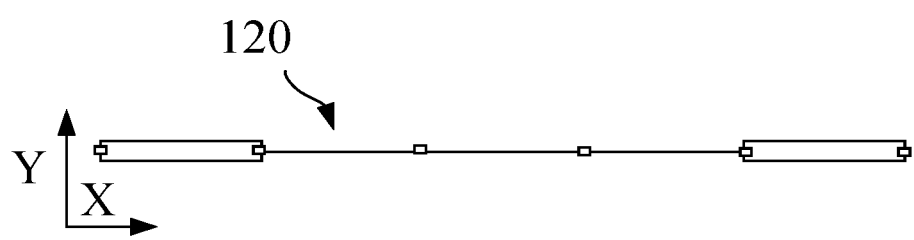
FIG. 12 is a schematic structural view illustrating a secondary electrode in a solar cell according to embodiments of the disclosure.
Figure 13:
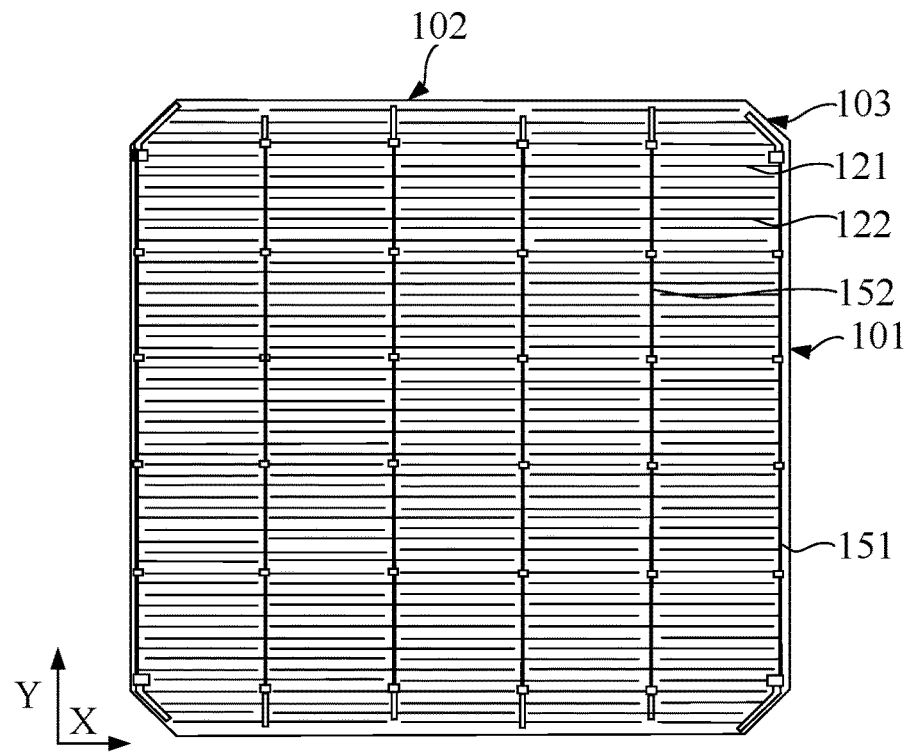
FIG. 13 is a schematic structural view illustrating a solar cell according to other embodiments of the disclosure.
Figure 14:
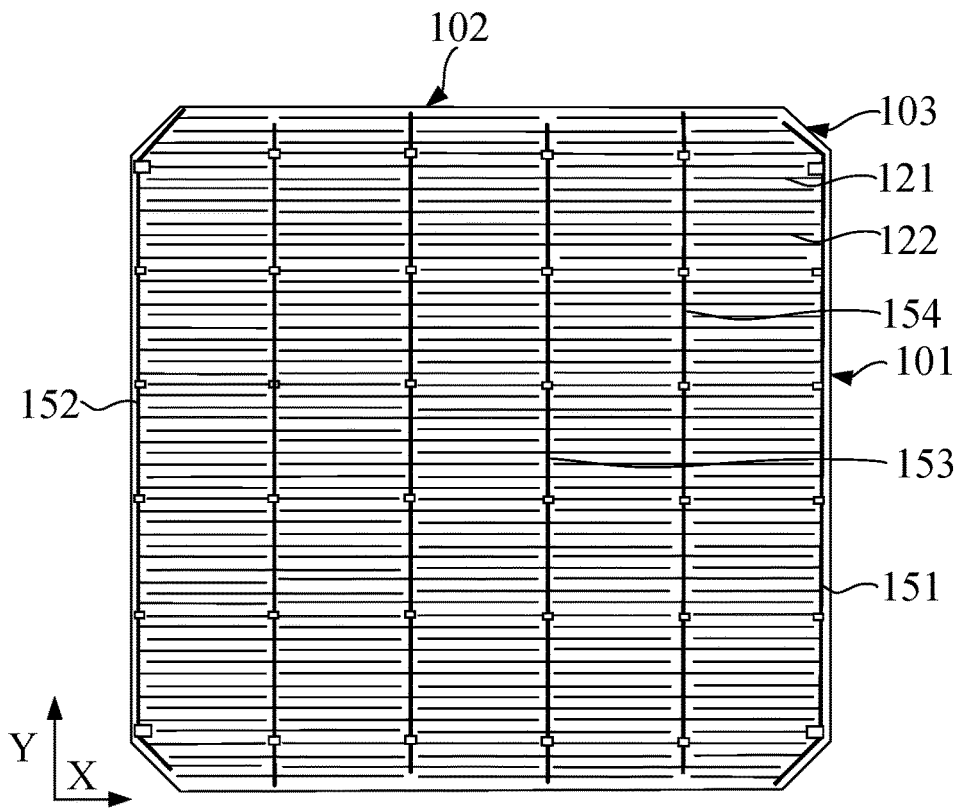
FIG. 14 is a schematic structural view illustrating a solar cell according to other embodiments of the disclosure.
Figure 15:
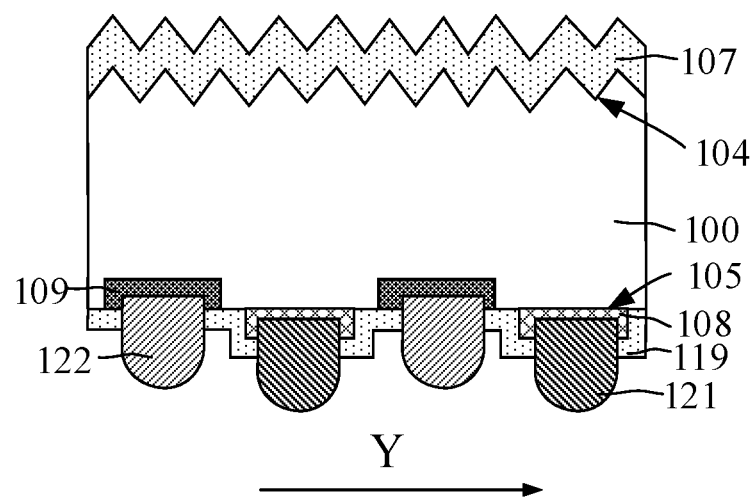
FIG. 15 is a partial structural view of the solar cell according to other embodiments of the disclosure.

FIG. 1 is a schematic structural view illustrating a solar cell according to embodiments of the disclosure. FIG. 2 is a partial structural view illustrating a solar cell according to embodiments of the disclosure. FIG. 3A is a schematic structural view illustrating a solar cell according to other embodiments of the disclosure. FIG. 3B is a schematic structural view illustrating a solar cell according to other embodiments of the disclosure. FIG. 4 is an enlarged partial view of part A in FIG. 3B. FIG. 5 is a schematic structural view illustrating a solar cell according to other embodiments of the disclosure. FIG. 6 is a schematic structural view illustrating a solar cell according to other embodiments of the disclosure. FIG. 7 is a schematic structural view illustrating a first main electrode in a solar cell according to embodiments of the disclosure. FIG. 8 is a schematic structural view illustrating a first main electrode in a solar cell according to other embodiments of the disclosure. FIG. 9 is a schematic structural view illustrating a first main electrode in a solar cell according to other embodiments of the disclosure. FIG. 10 is a schematic structural view illustrating a first main electrode in a solar cell according to other embodiments of the disclosure. FIG. 11 is a schematic structural view illustrating a second main electrode in a solar cell according to embodiments of the disclosure. FIG. 12 is a schematic structural view illustrating a secondary electrode in a solar cell according to embodiments of the disclosure. FIG. 13 is a schematic structural view illustrating a solar cell according to other embodiments of the disclosure. FIG. 14 is a schematic structural view illustrating a solar cell according to other embodiments of the disclosure. FIG. 15 is a partial structural view of the solar cell according to other embodiments of the disclosure.

According to some embodiments of the disclosure, referring to FIGS. 1 to 15, a solar cell includes a substrate 100, a passivation layer, a plurality of secondary electrodes 120, and at least one main electrode 110. The substrate 100 has first edges 101 and second edges 102, where the first edges 101 include two opposite edges of the substrate 100 along a second direction Y and the second edges 102 include two opposite edges of the substrate 100 along a first direction X. The passivation layer is disposed on the substrate 100. The plurality of secondary electrodes 120 are arranged at intervals along the second direction Y on the substrate 100, where each of the plurality of secondary electrodes 120 extends along the first direction X, and penetrates through the passivation layer to be in contact with the substrate 100. The at least one main electrode 110 is located on a surface of the passivation layer. Each of the at least one main electrode 110 includes two connection pads 113 respectively close to the second edges 102 and a connection wire 114, where each port of ports of the connection wire 114 near a corresponding second edge 102 is closed, and a surface of a portion of the connection wire 114 other than the ports is in contact with each connection pad 113. A first cross-sectional area of a part of the connection wire 114 between a respective connection pad 113 and a second edge 102 adjacent to the respective connection pad 113 is larger than a second cross-sectional area of another part of the connection wire 114 between the two connection pads 113.

In some embodiments, the solar cell can be a monocrystalline silicon solar cell, a polycrystalline silicon solar cell, an amorphous silicon solar cell, or a multi-component compound solar cell. The multi-component compound solar cell can specifically be a cadmium sulfide solar cell, a gallium arsenide solar cell, a copper indium selenium solar cell, or a perovskite solar cell. The solar cell can also be any one of a passivated emitter and rear cell (PERC) cell, a passivated emitter and rear totally-diffused (PERT) cell, a tunnel oxide passivated contact (TOPCon) cell, and a heterojunction with intrinsic thin layer/heterojunction technology (HIT/HJT) cell. A structure of the solar cell shown in FIG. 2 is taken as an example for illustration.

The substrate 100 is a region that absorbs incident photons and generates photo-generated carriers. In some embodiments, the substrate 100 may be a silicon substrate. The silicon substrate may be made of at least one material selected from a group of consisting of single crystal silicon, polysilicon, amorphous silicon, and microcrystalline silicon. In other embodiments, the substrate 100 may be made of silicon carbide, organic materials, or multinary compounds. The multinary compounds may include, but are not limited to, materials such as perovskite, gallium arsenide, cadmium telluride, copper indium selenium, and the like. In one example, the substrate 100 in embodiments of the disclosure is a monocrystalline silicon substrate.

In some embodiments, a front surface of the substrate 100 is a light receiving surface that absorbs incident light and aback surface of the substrate 100 is a backlight surface. The substrate 100 is doped with a doping element of an N-type or a P-type. The N-type element may be a group V element such as a phosphorus (P) element, a bismuth (Bi) element, an antimony (Sb) element, or an arsenic (As) element. The P-type element may be a group III element, such as a boron (B) element, an aluminum (Al) element, a gallium (Ga) element, or an indium (In) element. For example, when the substrate 100 is a P-type substrate 100, the substrate 100 is doped with the doping element of the P-type. For another example, when the substrate 100 is an N-type substrate, the substrate 100 is doped with the doping element of the N-type.

In some embodiments, the substrate 100 includes a first surface 104 and a second surface 105 opposite to the first surface 104. The first surface 104 of the substrate 100 is provided with an emitter 106, and the emitter 106 and the substrate 100 are doped with doping elements of different types. A surface of the emitter 106 may be a textured surface (i.e., pyramid-textured surface structure), to reduce light reflection of the first surface 104 of the substrate 100 to the incident light, thereby increasing the absorption and utilization of the light.

The first direction X and the second direction Y may be perpendicular to each other, or there may be an angle of less than 90 degrees between the first direction X and the second direction Y, for example, there is an angle of 60 degrees, 45 degrees, or 30 degrees between the first direction X and the second direction Y. In embodiments of the disclosure, the first direction X and the second direction Y are not in a same direction. To facilitate explanation and understanding, in embodiments of the disclosure, the first direction X being perpendicular to the second direction Y is taken as an example for illustration. In specific applications, the angle between the first direction X and the second direction Y can be adjusted according to actual needs and application scenarios. The disclosure is not limited thereto.

In some embodiments, a chamfer 103 is provided at a junction of the first edge 101 and the second edge 102. In the second direction Y, each of the two connection pads 113 is located in an edge region outside a corresponding chamfer 103 along the second direction Y, so that the connection pad 113 does not directly face the chamfer 103, which can avoid cracks and micro-cracks at the chamfer 103 during welding or laminating. The connection pad 113 is close to the chamfer 103, the current collected at the chamfer 103 can be collected by the welding strip in a shortest transmission path, thereby reducing the path loss and improving the cell efficiency of the solar cell. Specifically, referring to FIG. 1, a distance between a side of the connection pad 113 close to the second edge 102 and a side of the chamfer 103 facing the connection pad 113 is relatively small or the side of the connection pad 113 close to the second edge 102 is adjacent to the side of the chamfer 103 facing the connection pad 113, so that the connection pad 113 can be considered to be located in the edge region outside the chamfer 103 along the second direction Y. A relatively small distance may mean that the distance between the side of the connection pad 113 close to the second edge 102 and the side of the chamfer 103 facing the connection pad 113 is smaller than a grid pitch between the adjacent secondary electrodes 120.

In some embodiments, along the second direction Y, the distance between an end of the connection pad 113 close to the second edge 102 and an edge of the chamfer 103 facing the connection pad 113 along the second direction Y is less than or equal to the grid pitch between the adjacent secondary electrodes 120, which further illustrates that the current collected at the chamfer 103 can be collected by the welding strip in the shortest transmission path, thereby reducing path loss and improving the cell efficiency of the solar cell.

In some embodiments, the passivation layer may be a monolayer structure or a laminated structure. The passivation layer may be made from at least one material selected from a group of consisting of silicon oxide, silicon nitride, silicon oxynitride, silicon carbonitride, titanium oxide, hafnium oxide, or aluminum oxide. The passivation layer may include a first passivation layer 111 and a second passivation layer 112. The first passivation layer 111 is located on a surface of the emitter 106 away from the substrate 100. The first passivation layer 111 may be regarded as a front passivation layer. The second passivation layer 112 is located on the second surface 105 of the substrate 100, and the second passivation layer 112 may be regarded as a rear passivation layer.

In some embodiments, the secondary electrodes 120 are grid lines of the solar cell for collecting and converging the current of the solar cell. The secondary electrodes 120 may be sintered from a burn-through paste. The material of the secondary electrode 120 may be one or more of aluminum, silver, gold, nickel, molybdenum, or copper. In some cases, the secondary electrode 120 refers to a fine grid line or a finger grid line, to be distinguished from a main grid line or a bus bar. The secondary electrodes 120 include first electrodes 121 and second electrodes 122. The first electrodes 121 penetrate through the first passivation layer 111 to be in contact with the emitter 106. The first electrodes 121 are regarded as upper electrodes or front electrodes. The second electrodes 122 penetrate through the second passivation layer 112 to be in contact with the second surface 105 of the substrate 100. The second electrodes 122 are regarded as lower electrodes or back electrodes.

In some embodiments, the main electrode 110 (i.e., the first main electrode 130 and the second main electrode 140 mentioned below) is regarded as the main grid line of the solar cell. The main grid line here is not the main grid line in the traditional sense. Instead, the main grid line is a bridge connecting the secondary electrodes 120 through the connection wire 114 (for example, the first connection wire 132 mentioned below), and is connected with welding strips (for connecting solar cells) through the connection pads 113 to collect current, so that the relatively thin connection wire 114 (e.g., the first connection wire 132 and the second connection wire 142 mentioned below) can be arranged, to reduce the effective light shielding area, reduce resistance loss, and increase the total power of the assembly. The main electrodes 110 can be arranged densely to shorten the path of current passing through the fine grid line, thereby improving the photoelectric conversion efficiency of the solar cell. The thin connection line 114 (e.g., the first connection line 132 mentioned below) and the connection pad 113 (e.g., the first sub-connection pad 131 mentioned below) can also avoid the risk of cracks and micro-cracks at the silicon wafer. Therefore, the main electrodes 110 are provided at the edge of the solar cell having the risk of cracking and micro-cracking, such that the current collection capability at the edge can be improved, and the current collection or conduction path is more optimized.

In some embodiments, each connection line 114 (e.g., a following first connection line 132) is electrically connected to the plurality of secondary electrodes 120 for collecting current from each secondary grid line. The connection line 114 is set to be thin, and a width of the connection line 114 is in a range of 20 µm to 200 µm. For example, the width of the connection line 114 is in a range of 20 µm to 150 µm, such as, 28 µm, 58 µm, 98 µm, 135 µm, or 150 µm. By setting the width of the connection line 114 in this range, the light shielding area can be reduced, the shadow loss of the contact grid line can be reduced, and the current collection capability can be improved.

In some embodiments, the connection wire 114 (e.g., a subsequent first connection wire 132) is closed at each port of ports close to the second edge 102, which is different from a conventional harpoon connection wire. That is, in embodiments of the disclosure, the connection wire 114 has only one connection wire connected with each connection pad 113 (for example, the following first sub-connection pad 131). Although the harpoon connection wire can increase the contact points and transmission paths between the main electrodes and the secondary electrodes, the conventional thinner connection wire may cause greater resistance damage of the main electrodes and affect the cell efficiency. Compared with the harpoon connection wire composed of at least two connection wires, only one connection wire is provided, which may reduce the slurry cost and does not affect the alignment of subsequent welding strips. Each port of the connection line 114 near the second edge 102 is not in contact with the connection pad 113 and the connection pad 113 is in contact with a region outside the ports of the connection line 114. In this way, when a chamfer 103 is provided at each corner of the substrate 100, the connection pad 113 is not located in a region where the chamfer 103 directly faces, and the connection line 114 may be located in the region where the chamfer 103 directly faces, thereby collecting the current at the chamfer 103, reducing the carrier transport path in the region of the chamfer 103 to reduce the transport loss, and also avoiding the risk of damage due to the arrangement of the connection pad 113 at the chamfer 103.

The cross-sectional area refers to a product of a width and a height. To avoid a risk that the solar cell may be cracked or micro-cracked due to different forces in different parts of the solar cell during being connected with the welding strips or lamination, a height of the connection wire 114 is set to be the same everywhere. Therefore, the first cross-sectional area being larger than the second cross-sectional area may be referred to that a first width of the part of the connection wire 114 between the connection pad 113 and the second edge 102 is larger than a second width of the another part of the connection wire 114 between the two adjacent connection pads 113.

In other embodiments, to avoid the risk of cracking of the part of the connection wire 114 close to the edge, it is possible to set a height of the part of the connection wire 114 (e.g., a first sub-connection wire 116) between the connection pad 113 and the second edge 102 to be slightly lower than a height of the another part of the connection wire 114 (e.g., a second sub-connection wire 117 and a third sub-connection wire 118) between the two adjacent connection pads 113. In this way, the first width of the part of the connection wire 114 between the connection pad 113 and the second edge 102 is also greater than the second width of the another part of the connection wire 114 between the two adjacent connection pads 113. The first sub-connection wire 116 is relatively wider, which can relieve the welding stress of the connection pads 113, so as to form a good contact between the welding strip and the main electrode 110. In addition, the relatively wider first sub-connection wire 116 can relieve the collection pressure of the connection pads 113 and improve the carrier transmission capacity, and the relatively wider first sub-connection line 116 has a relatively larger transmission area for collecting current.

In some embodiments, a difference between the first cross-sectional area and the second cross-sectional area is proportional to a spacing S between the connection pad 113 and the adjacent second edge 102. When the spacing S between the connection pad 113 and the adjacent second edge 102 is relatively large, the first cross-sectional area is also large, that is, the first width is relatively large, so that the transmission area for the current collected is also large, thereby relieving the collection pressure and improving the performance of the solar cell. The difference between the first cross-sectional area and the second cross-sectional area can be deemed as a difference between the first width and the second width. The difference between the first width and the second width is less than 100 μm. Further, the difference between the first width and the second width is less than 80 μm. The difference between the first width and the second width may be, in particular, 15 μm, 39 μm, 68 μm, or 80 μm. With aid of this configuration, the difference between the first width and the second width can satisfy that the width of the first sub-connection wire 116 is relatively larger, the first sub-connection wire 116 has better ability for collecting carrier at the second edge, and the shielding area is appropriate to reduce the optical loss. In addition, the cross-sectional area of the second sub-connection wire 117 and the third sub-connection wire 118 is appropriate, such that the conductivity is good and the resistance loss is relatively small.

In some embodiments, the first width is in a range of 20 μm to 200 μm. Preferably, the first width is in the range of 20 μm to 150 μm, and specifically, the first width may be 28 μm, 58 μm, 98 μm, 135 μm, or 150 μm. As such, the first sub-connection wire 116 having the width in this range can reduce the shielding area, reduce the shadow loss of the contact grid lines, and improve the current collection capability.

In some embodiments, the second width is in a range of 20 μm to 100 μm. Preferably, the second width is in the range of 20 μm to 80 μm, and specifically, the second width may be 28 μm, 39 μm, 52 μm, 71 μm, or 80 μm. Therefore, the cross-sectional area of the second sub-connection wire 117 and the third sub-connection wire 118 is appropriate, the conductivity is good, and the resistance loss is relatively small.

In some embodiments, the spacing S between the connection pad 113 and the adjacent second edge 102 is in a range of 3 mm to 15 mm. Preferably, the spacing S is in the range of 3 mm to 13 mm, for example, the spacing S is 3 mm, 5.8 mm, 9.4 mm, or 13 mm. The spacing S between the connection pad 113 and the second edge 102 is appropriate, so that the carrier at the second edge 102 can be collected, and the risk of cracking and breakage caused by welding the welding strip can be avoided.

In some embodiments, the connection pad 113 may be deemed as a contact point where the main electrode 110 is in contact with the welding strip. The connection pad 113 may be in contact with the secondary electrode 120. Alternatively, the connection pad 113 may not be in contact with the secondary electrode 120, and may be electrically connected to the secondary electrode 120 through the connection line 114.

In some embodiments, the main electrode 110 further includes at least one second connection pad 115 disposed between the two connection pads 113. The connection wire 114 is in contact with each second connection pad 115. For a same main electrode 110, a third cross-sectional area of a part of the connection wire 114 (i.e., a third sub-connection wire 118) located between two adjacent second connection pads 115 is a smallest cross-sectional area. Alternatively, the connection wire 114 includes a first sub-connection wire 116 between the second edge and the adjacent connection pad 113, a second sub-connection wire 117 between the connection pad 113 and the adjacent second connection pad 115, and a third sub-connection wire 118 between the adjacent second connection pads 115, where the third sub-connection wire 118 has a smallest third cross-sectional area. In one example, a fourth cross-sectional area of the second sub-connection wire 117 is equal to the third cross-sectional area, i.e., the first cross-sectional area is larger than the third cross-sectional area and the fourth cross-sectional area. The connection wire 114 (e.g., the second sub-connection wire 117 and the third sub-connection wire 118) in a middle region is relative thinner, so that the shielding area of the grid line can be reduced. In another example, the fourth cross-sectional area of the second sub-connection wire 117 is larger than the third cross-sectional area, so that the first cross-sectional area is a largest cross-sectional area, the fourth cross-sectional area is a second largest cross-sectional area, and the third cross-sectional area is the smallest cross-sectional area. In this way, it is possible to ensure that the shielding area in the middle region of the substrate 100 is relatively small, a width of the edge region of the substrate 100 is relatively large, and the connection wire 114 is in better contact with the secondary electrodes 120, such that the current collection capability may be better.

In some embodiments, an area of each of the two connection pads 113 is larger than an area of any of the at least one second connection pad 115. When the area of the connection pad 113 at the edge is relatively larger, the connection pad 113 can be used as a reference for the alignment of the welding strip, to avoid welding deviation between the welding strip and the main electrode 110. In addition, the relatively larger area of the connection pad 113 can also relieve the welding pressure of the welding strip and improve the current collection ability at the edge.

In some embodiments, the main electrode 110 is a connection wire composed of a plurality of sections of sub-connection wires, and a width of the first sub-connection wire 116 is greater than a width of the second sub-connection wire 117 and a width of the third sub-connection wire 118. Compared with only one connection wire whose width gradually decreases or increases, the connection wire provided in the disclosure is more beneficial to the alignment of welding strips, reduces the difficulty of the preparation process, and simultaneously reduces the shielding area on the non-edge region of the substrate, such that higher photoelectric conversion efficiency can be achieved.

In some embodiments, referring to FIG. 3A, the at least one main electrode 110 includes two first main electrodes 130 and at least one second main electrode 140. The first main electrodes 130 are disposed on the surface of the passivation layer, and each first main electrode 130 is close to a corresponding first edge 101. The at least one second main electrode 140 is located between the two first main electrodes 130, and is disposed on the surface of the passivation layer.

In some embodiments as shown in FIG. 3A, each first main electrode 130 includes two first sub-connection pads 131 (or two first sub-connection disks 143 described below) respectively close to the second edges 102, and a first connection wire 132. The first connection wire 132 is closed at each port of ports respectively close to the second edge 102, and a surface of a portion of the first connection wire 132 other than the ports is in contact with each of the two first sub-connection pads 131. A fifth cross-sectional area of a part of the first connection wire 132 between the first sub-connection pad 131 and the adjacent second edge 102 is larger than a sixth cross-sectional area of another part of the first connection wire 132 between the two first sub-connection pads 131.

In some embodiments, the first main electrode 130 further includes at least one third sub-connection pad 133 (or at least one second sub-connection disk 144 described below). The at least one third sub-connection pad 133 is disposed between the two first sub-connection pads 131. The first connection wire 132 is in contact with each third sub-connection pad 133. For a same first main electrode 130, a seventh cross-sectional area of a part of the first connection wire 132 located between two adjacent third sub-connection pads 133 is a smallest cross-sectional area. Alternatively, the first connection wire 132 includes a first connection section 134 disposed between the first sub-connection pad 131 and the adjacent second edge 102, a second connection section 136 disposed between the first sub-connection pad 131 and the adjacent third sub-connection pad 133, and a third connection section 137 disposed between adjacent third sub-connection pads 133, the third connection section 137 has a smallest seventh cross-sectional area. In one example, referring to FIG. 9, an eighth cross-sectional area of the second connection section 136 is equal to the seventh cross-sectional area (i.e., the fifth cross-sectional area is larger than the seventh cross-sectional area and the eighth cross-sectional area). The first connection wire 132 in the middle region is thinner, which can reduce the shielding area of the grid line. In another example, referring to FIG. 10, the eighth cross-sectional area of the second connection section 136 is larger than the seventh cross-sectional area. That is, the fifth cross-sectional area is the largest cross-sectional area, the eighth cross-sectional area is a second largest cross-sectional area, and the seventh cross-sectional area is a smallest largest cross-sectional area. With aid of this configuration, it is possible to ensure that the shielding area in the middle region of the substrate 100 is small, the width of the edge region is relatively large, and a good contact between the first connection wire 132 and the secondary electrodes 120 may be obtained, such that a better current collection ability may be achieved.

In some embodiments, as illustrated in FIG. 3B, each first main electrode 130 includes a plurality of first sub-connection pads 131 arranged at intervals along the second direction Y and a first connection wire 132. The first connection wire 132 is in contact with a side of each of at least one of the first sub-connection pads 131 near the first edge 101. The first main electrode 130 is adjacent to corresponding chamfers 103. In the second direction Y, the first of the first sub-connection pads 131 and/or the last of the first sub-connection pads 131 are located in an edge region outside the chamfers 103 along the second direction Y, so that at least one of the first of the first sub-connection pads 131 and the last of the first sub-connection pads 131 is not located in a region directly facing the chamfer 103, which can avoid cracks and microcracks at the chamfer 103 during welding or laminating. When the first sub-connection pad 131 is close to the chamfer 103, the current collected at the chamfer 103 can be collected by the welding strip in a shortest transmission path, thereby reducing the path loss and improving the cell efficiency of the solar cell. Specifically, referring to FIG. 3B, a distance between a side of the first of the first sub-connection pads 131 near the second edge 102 and a side of the chamfer 103 facing the first sub-connection pad is relatively small or the side of the first of the first sub-connection pads 131 near the second edge 102 is adjacent to the side of the chamfer 103 facing the first sub-connection pad, so that the first sub-connection pad 131 can be considered to be located in the edge region outside the chamfer 103 in the second direction Y. A relatively small distance may mean that the distance between the side of the first of the first sub-connection pads 131 near the second edge 102 and the side of the chamfer 103 facing the first sub-connection pad is smaller than the grid pitch between the adjacent secondary electrodes 120.

In some embodiments, along the second direction Y, a distance between an end of the first sub-connection pad 131 close to the second edge and an edge of the chamfer 103 facing the first sub-connection pad 131 along the second direction Y is less than or equal to the grid pitch between the adjacent secondary electrodes 120, which further illustrates that the current collected at the chamfer 103 can be collected by the welding strip in the shortest transmission path, thereby reducing the path loss and improving the battery efficiency of the solar cell.

In some embodiments, as illustrated in FIGS. 3A and 3B, each second main electrode 140 includes a second connection wire 142. The second connection wire 142 is closed at each port of ports respectively close to the second edges 102. A cross-sectional area of the first connection wire 132 is larger than or equal to a cross-sectional area of the second connection wire 142. For a second main electrode 140 in the non-edge region, the relatively thin second connection wire 142 ensures that a grid line shielding area of the second main electrode 140 is relatively smaller. For the first main electrode 130 in the edge region, the relatively wide first connection wire 132 increase a cross-sectional area of electrical contact between the first connection wire 132 and each secondary electrode 120, reduces the resistance of the first connection wire 132, and improves the current collection and transmission capability of the first connection wire 132 adjacent to the edge of the substrate 100 compared with the thinner second connection wire 142, thereby improving the edge current collection capability and photoelectric conversion efficiency of the whole solar cell.

In some embodiments, a first pitch m between the first main electrode 130 and the adjacent second main electrode 140 is not equal to a second pitch n between the adjacent second main electrodes 140. In one example, the first pitch m is larger than the second pitch n, i.e., the first main electrode 130 is close to the first edge 101. The main electrodes at the edges are sparsely arranged, so that the risk of micro-cracking and the like of the solar cell can be avoided during welding and laminating. A ratio P of the first distance m to the second pitch n ranges from 1.5 to 1 (i.e., 1.5≥P>1), and further, 1.3≥P>1.1, 1.45≥P>1.05, 1.38≥P>1, or 1.5≥P>1.2. In another example, the first pitch m is less than the second pitch n, which may ensure that the first main electrodes 130 at the edges and the second main electrodes 140 are densely arranged and a path of current from the secondary electrode 120 to the main electrode is shorter, thereby reducing loss and facilitating the ability of the electrodes to collect current at the edges. In this case, the ratio P of the first distance m to the second pitch n ranges from 1 to 0.5 (i.e., 1>P≥0.5), and further, 0.8>P≥0.5, 0.9≥P≥0.7, 0.98≥P≥0.53, or 0.8≥P≥0.5.

In some embodiments, the first connection wire 132 and the second connection wire 142 are made of same materials, i.e., the first connection wire 132 and the second connection wire 142 are made under a same fabrication process.

In some embodiments, the second main electrode 140 further includes a plurality of second sub-connection pads 141 arranged at intervals in the second direction Y. The first of the plurality of second sub-connection pads 141 and the last of the plurality of second sub-connection pads 141 are respectively adjacent to the second edges 102, and each second sub-connection pad 141 is in contact with the second connection line 142 (i.e., the second connection line 142 is in contact with at least one of the second sub-connection pads 141). In the second direction Y, a first distance between the first of the first sub-connection pads 131 and the adjacent second edge 102 is greater than a second distance between the first of the second sub-connection pads 141 and the second edge 102. Since the chamfer 103 is provided at the junction the first edge 101 and the second edge 102 of the substrate 100, the first sub-connection pad 131 is relatively far away from the second edge 102, and the second sub-connection pad 141 is closer to the second edge 102 than the first sub-connection pad 131, such that the current transmission path at the second edge 102 can be shortened, and the current collection ability of the second edge 102 can be improved.

In some embodiments, the first sub-connection pad 131 may be regarded as a contact point where the first main electrode 130 is in contact with the welding strip. The first sub-connection pad 131 may be in contact with the secondary electrode. Alternatively, the first sub-connection pad 131 may not be in contact with the secondary electrode and may be electrically connected to the secondary electrode through the first connection line 132. Similarly, the second sub-connection pad 141 is a contact point where the second main electrode 140 is in contact with the welding strip.

In some embodiments, an area of each first sub-connection pad 131 is larger than an area of any of the second sub-connection pads 141. When the area of each first sub-connection pad 131 located at the edge is larger, the first sub-connection pad 131 can be used as a reference for the alignment of the welding strip, to avoid welding deviation between the welding strip and the first main electrode 130. In addition, the relatively larger area of the first sub-connection pad 131 can also relieve the pressure of the welding strip and improve the current collection ability at the edge, and the relatively smaller area of the second sub-connection pad 141 can reduce the shielding area.

In some embodiments, with reference to FIGS. 3B and 4, the first connection wire 132 is in contact with a side of each of at least one of the first sub-connection pads 131 close to the first edge 101. The first connection wire 132 is closer to the first edge 101, and the ability of the first connection wire 132 to collect the current at the first edge 101 is enhanced. In addition, at least one width of the first connection wire 132 is separated between the first sub-connection pad 131 and the first edge 101, so that the breakage caused by poor stress at the edge can be avoided during welding and laminating. When the first sub-connection pad 131 is in contact with the secondary electrode, the secondary electrode is in contact with a side of the first sub-connection pad 131 away from the first edge 101, so that the current collected by the secondary electrode can be directly collected by the first sub-connection pad and converged on the welding strip, thereby reducing the current transmission path.

In some embodiments, referring to FIGS. 4 to 8, the first connection wire 132 includes a first connection section 134 close to an outside of the chamfer 103 in the first direction X and a second connection section 135 connected to the first connection section 134. The first connection section 134 has a cross-sectional area larger than a cross-sectional area of the second connection section 135. Alternatively, an eleventh cross-sectional area of a part of the first connection wire 132 between the first of the first sub-connection pads 131 and the adjacent second edge 102 is larger than a twelfth cross-sectional area of another part of the first connection wire 132 between the first of the first sub-connection pads 131 and the last of the first sub-connection pads 131. A width of the part of the first connection wire 132 between the first of the first sub-connection pads 131 and the adjacent second edge 102 is larger, so that the welding stress of the first sub-connection pad 131 can be relieved to form a good contact between the welding strip and the first main electrode 130. In addition, the wider first connection wire 132 can relieve the pressure of the current collection of the first sub-connection pad 131 and improve the carrier transmission capacity, and the wider first connection wire 132 has a larger transmission area for current collection.

It can be understood that the first connection section 134 refers to the part of the first connection wire 132 between the first of the first sub-connection pads 131 and the adjacent second edge 102, and the second connection section 135 refers to the another part of the first connection wire 132 between the first of the first sub-connection pads 131 and the last of the first sub-connection pads 131.

To avoid cracking or micro-cracking of the solar cell due to different forces in different parts of the solar cell during being connected with welding strips or lamination, a height of the first connection wire 132 is set to be the same everywhere. Therefore, the eleventh cross-sectional area being larger than the twelfth cross-sectional area may be considered that a third width of the part of the first connection wire 132 between the first of the first sub-connection pads 131 and the adjacent second edge 102 is larger than a fourth width of the another part of the first connection wire 132 between the first of the first sub-connection pads 131 and the last of the first sub-connection pads 131.

In other embodiments, to avoid cracking of the part of the first connection wire 132 close to the edge, it is possible to set a height of the part of the first connection wire 132 between the first of the first sub-connection pads 131 and the adjacent second edge 102 to be slightly lower than a height of the another part of the first connection wire 132 between the first of the first sub-connection pads 131 and the last of the first sub-connection pads 131. In this way, the third width of the part of the first connection wire 132 between the first of the first sub-connection pads 131 and the adjacent second edge 102 is greater than the fourth width of the another part of the first connection wire 132 between the first of the first sub-connection pads 131 and the last of the first sub-connection pads 131. The part of the first connection wire 132 between the first of the first sub-connection pads 131 and the adjacent second edge 102 is wider, which can relieve the welding stress of the first sub-connection pad 131, so as to form a good contact between the welding strip and the first main electrode 130. In addition, the wider first connection wire 132 can relieve the pressure of the current collection of the first sub-connection pad 131 and improve the carrier transmission capacity, and the wider first connection wire 132 has a larger transmission area for current collection.

In some embodiments, a difference between the eleventh cross-sectional area and the twelfth cross-sectional area is proportional to a spacing S between the first of the first sub-connection pads 131 and the adjacent second edge 102. When the spacing S between the first of the first sub-connection pads 131 and the adjacent second edge 102 is large, the eleventh cross-sectional area is also large, that is, the third width is also large, so that the transmission area for the current collection is also large, thereby relieving the collection pressure and improving the cell performance. The difference between the eleventh cross-sectional area and the twelfth cross-sectional area can be regarded as a difference between the third width and the fourth width. The difference between the third width and the fourth width is less than 100 μm. Further, the difference between the third width and the fourth width is less than 80 μm. The difference between the third width and the fourth width may be, in particular, 15 μm, 39 μm, 68 μm, or 80 μm. With aid of this configuration, the difference between the third width and the fourth width can satisfy that the width of the first connection section 134 is larger, the first connection section 134 has better ability for collecting carrier at the second edge, and the shielding area is appropriate to reduce the optical loss. In addition, the cross-sectional area of the second connection section 135 is appropriate, such that the conductivity is good and the resistance loss is small.

In some embodiments, the third width is in a range of 20 μm to 200 μm. Preferably, the third width is in the range of 20 μm to 150 μm, and specifically, the third width is 28 μm, 58 μm, 98 μm, 135 μm, or 150 μm. As such, the first connection section 134 having the width in this range can reduce the shielding area, reduce the shadow loss of the contact grid lines, and improve the current collection capability. The fourth width is in a range of 20 μm to 100 μm. Preferably, the fourth width is in the range of 20 μm to 80 μm, and specifically, the fourth width is 28 μm, 39 μm, 52 μm, 71 μm, or 80 μm. Therefore, the cross-sectional area of the second connection section 135 is appropriate, the conductivity is good, and the resistance loss is small. The spacing S between the first sub-connection pad 131 and the adjacent second edge 102 ranges from 3 mm to 15 mm, preferably, from 3 mm to 13 mm. The spacing S may be 3 mm, 5.8 mm, 9.4 mm, or 13 mm. The spacing between the first sub-connection pad 131 and the second edge 102 is appropriate, so that the carrier at the second edge 102 can be collected, and the risk of cracking and breakage caused by welding the welding strip can be avoided.

In some embodiments, referring to FIGS. 3B to 8, the plurality of first sub-connection pads 131 include two first sub-connection disks 143 and at least one second sub-connection disk 144 disposed between the two first sub-connection disks 143. There are one or more second sub-connection disks 144. A seventh cross-sectional area of a part of the first connection wire 132 (third connection section 137) located between two adjacent second sub-connection disks 144 is a smallest cross-sectional area. In one example, referring to FIG. 8, an eighth cross-sectional area of a part of the first connection wire 132 (second connection section 136) located between the first sub-connection disk 143 and the adjacent second sub-connection disk 144 is equal to the seventh cross-sectional area. That is, the first connection wire 132 in the middle region is thinner, which can reduce the shielding area of the grid line. In another example, the eighth cross-sectional area of the part of the first connection wire 132 (second connection section 136) between the first sub-connection disk 143 and the adjacent second sub-connection disk 144 is larger than the seventh cross-sectional area. In this way, the eleventh cross-sectional area is the largest cross-sectional area, the eighth cross-sectional area is a second cross-sectional area, and the seventh cross-sectional area is the smallest cross-sectional area. With aid of this configuration, it is possible to ensure that the shielding area in the middle region of the substrate 100 is small, the width of the edge region is relatively large, and a good contact between the first connection wire 132 and the secondary electrodes 120 may be obtained, such that a better current collection ability may be achieved.

In some embodiments, an area of the first sub-connection disk 143 is larger than an area of the second sub-connection disk 144. When the area of the first sub-connection disk 143 located at the edge is large, the first sub-connection disk 143 can be used as a reference for the alignment of the welding strip, to avoid welding deviation between the welding strip and the first main electrode 130. In addition, the relatively larger area of the first sub-connection disk 143 can also relieve the pressure of the welding strip and improve the current collection ability at the edge.

In some embodiments, the second connection wire 142 is closed at each port of ports respectively close to the second edges 102. The cross-sectional area of the first connection wire 132 is larger than or equal to the cross-sectional area of the second connection wire 142. For the second main electrode 140 in the non-edge region, the relatively thin second connection wire 142 ensures that a grid line shielding area of the second main electrode 140 is relatively smaller. For the first main electrode 130 in the edge region, a relatively wide first connection wire 132 increase a cross-sectional area of electrical contact between the first connection wire 132 and each secondary electrode 120, reduces the resistance of the first connection wire 132, and improves the current collection and transmission capability of the first connection wire 132 adjacent to the edge of the substrate 100 compared with the thinner second connection wire 142, thereby improving the edge current collection capability and photoelectric conversion efficiency of the whole solar cell.

In some embodiments, referring to FIGS. 3A and 11, the second connection wire 142 is closed at each port of ports respectively close to the second edges 102 and a surface of a portion of the second connection wire 142 other than the ports is in contact with the second sub-connection pad 141. Referring to FIGS. 5, 6, and 11, a ninth cross-sectional area of a part of the second connection wire 142 (i.e., a fourth connection section 145) between the second sub-connection pad 141 and the adjacent second edge 102 is larger than a tenth cross-sectional area of another part of the second connection wire 142 (i.e., a fifth connection section 146) between two adjacent second sub-connection pads 141. A technical concept and the technical effect achieved of the ninth cross-sectional area being larger than the tenth cross-sectional area are the same as or similar to the technical concept and the technical effect achieved of the first cross-sectional area being larger than the second cross-sectional area, which are not repeated herein.

In some embodiments, referring to FIGS. 3A and 12, in the first direction X, a cross-sectional area of a part of the secondary electrode 120 near the first edge 101 is larger than a cross-sectional area of another part of the secondary electrode 120 away from the first edge 101, to enhance the current collection and transmission capability of the secondary electrodes 120 at the first edge 101.

In some embodiments, the solar cell is a multi-busbar (MBB) cell.

In some embodiments, referring to FIGS. 1 and 13, the connection wire is in contact with a side of each of at least one sub-connection pad adjacent to the first edge 101. The connection wire is close to the first edge 101, and the ability of the connection wire to collect the current at the first edge 101 is enhanced. In addition, at least one width of the first connection wire is separated between the sub-connection pad and the first edge 101, so that the breakage caused by poor stress at the edge can be avoided during welding and laminating. The sub-electrode 120 is in contact with a side of the sub-connection pad away from the first edge 101, so that the current collected by the secondary electrode can be collected directly by the sub-connection pad and converged onto the welding strip, thereby reducing the current transmission path.

In some embodiments, the solar cell is a back contact cell, such as an interdigitated back contact (IBC) cell. Referring to FIG. 15, the back contact cell includes a substrate 100, a third passivation layer 107 on a first surface 104 of the substrate 100; a first doped region 108 and a second doped region 109 located on a second surface 105 of the substrate 100; a fourth passivation layer 119 disposed on a surface of the first doped region 108 and the second doped region 109; first electrode s 121 which penetrate through the fourth passivation layer 119 to be connected to the first doped region 108; and second electrodes 122 which penetrate through the fourth passivation layer 119 to be connected to the second doped region 109. In other embodiments, the back contact cell includes a substrate; a third passivation layer on a first surface of the substrate; a first doped region provided on a second surface of the substrate, where the first doped region may have the same conductivity type as the substrate or may have a different conductivity type from the substrate; a tunneling oxide layer and a doped polysilicon layer, where the tunneling oxide layer and the doped polysilicon layer are located on the second surface of the substrate; a fourth passivation layer located a surface of the first doping region and the doped polysilicon layer; first electrodes which penetrate through the fourth passivation layer to be connected with the doped polysilicon layer; and second electrodes which penetrate the fourth passivation layer to be connected with the first doped region. In still other embodiments, the back contact cell includes a substrate, a third passivation layer on a first surface of the substrate; a tunneling oxide layer, a first doped polysilicon layer, and a second doped polysilicon layer disposed over the second surface of the substrate; a fourth passivation layer disposed on a surface of the first doped polysilicon layer, the second doped polysilicon layer, and the substrate; first electrodes which penetrate through the fourth passivation layer to be connected with the first doped polysilicon layer; and second electrodes which penetrate through the fourth passivation layer to be connected with the second doped polysilicon layer. It can be understood that the first surface 104 is a front surface of the silicon substrate, the second surface 105 is a back surface of the silicon substrate, the first doped region is one of the N-type doped region and the P-type doped region, and the second doped region is the other of the N-type doped region and the P-type doped region.

It can be understood that the "back contact cell" means that all the positive electrodes and the negative electrodes are in contact with a structure on the back surface of the substrate 100 for current collection, and there is no positive electrode and negative electrode disposed on the front surface of the substrate 100.

In some embodiments, the back contact cell includes a substrate 100, a passivation layer, a plurality of secondary electrodes 120, and at least one main electrode 110. The substrate 100 has first edges 101 and second edges 102, where the first edges 101 include two opposite edges of the substrate 100 along a second direction Y and the second edges 102 include two opposite edges of the substrate 100 along a first direction X. The passivation layer is disposed on the substrate 100. The plurality of secondary electrodes 120 are arranged at intervals along the second direction Y on the substrate 100, where each of the plurality of secondary electrodes 120 extends along the first direction X, and penetrates through the passivation layer to be in contact with the substrate 100. The at least one main electrode 110 is located on a surface of the passivation layer. Each of the at least one main electrode 110 includes two connection pads 113 respectively close to the second edges 102 and a connection wire 114, where each port of ports of the connection wire 114 near a corresponding second edge 102 is closed, and a surface of a portion of the connection wire 114 other than the ports is in contact with each connection pad 113. A first cross-sectional area of a part of the connection wire 114 between a respective connection pad 113 and a second edge 102 adjacent to the respective connection pad 113 is larger than a second cross-sectional area of another part of the connection wire 114 between the two connection pads 113.

In some embodiments, a difference between the first cross-sectional area and the second cross-sectional area is proportional to a spacing between the connection pad and the adjacent second edge. A first width of a part of the connection wire between the connection pad and the adjacent second edge is larger than a second width of another part of the connection wire between the connection pads.

In some embodiments, the secondary electrodes 120 include first electrodes 121 and second electrodes 122 that are alternatively arranged along the second direction. The first electrode 121 is one of a positive electrode and a negative electrode, and the second electrode 122 is the other of the positive electrode and the negative electrode. In embodiments of the disclosure, the first electrode 121 is taken as a positive electrode and the second electrode 122 is taken as a negative electrode for illustration. The secondary electrodes 120 include first electrodes 121 and second electrodes 122 alternatively arranged along the second direction Y.

In some embodiments, referring to FIG. 13, the at least one main electrode includes first grid line structures 151 and second grid line structures 152 alternatively arranged. Each first grid line structure 151 is electrically connected to corresponding first electrodes 121 and each second grid line structure 152 is electrically connected to corresponding second electrodes 122. Specifically, the at least one first main electrode includes a first edge grid line and a second edge grid line. The first edge grid line is electrically connected to the first electrodes 121 and the second edge grid line is electrically connected to the second electrodes 122.

In some embodiments, the first grid line structures 151 and the second grid line structures 152 are misaligned along the first direction X, so that along the second direction Y, a distance between an end of the first grid line structure 151 close to the second edge and the adjacent second edge is different from a distance between an end of the second grid line structure 152 close to the second edge and the adjacent second edge. In this way, it is possible to reduce the consumption of the conductive silver paste for the solar cell metallization and shorten the distance of current collection in the fine grid-line direction, thereby reducing the fragmentation rate. In addition, at least part of the main grid line may not be exposed to one end of the secondary electrode near the second edge, which is beautiful and ensures the adaptive length of the positive and negative electrodes of the solar cell, and can avoid the risk of short circuit between electrodes with different polarities.

In some embodiments, referring to FIG. 14, the second main electrodes include first grid line structures 153 and second grid line structures 154 alternately arranged. Each first grid line structure 153 is electrically connected to corresponding first electrodes 121 and each second grid line structure 154 is electrically connected to corresponding second electrodes 122. The two first main electrodes include a first edge grid line 151 and a second edge grid line 152. The first edge grid line 151 is electrically connected to the first electrodes 121 and the second edge grid line 152 is electrically connected to the second electrodes 122. Specifically, a second main electrode adjacent to the first edge grid line 151 having positive polarity is the second grid line structure 154, and a second main electrode adjacent to the second edge grid line 152 having negative polarity is the first grid line structure 153.

In some embodiments, the first grid line structures 153 and the second grid line structures 154 are misaligned along the first direction X, so that along the second direction Y, a distance between an end of the first grid line structure 153 close to the second edge and the adjacent second edge is different from a distance between an end of the second grid line structure 154 close to the second edge and the adjacent second edge. In this way, it is possible to reduce the consumption of the conductive silver paste for the solar cell metallization and shorten the distance of current collection in the fine grid-line direction, thereby reducing the fragmentation rate. In addition, at least part of the main grid line may not be exposed to one end of the secondary electrode near the second edge, which is beautiful and ensures the adaptive length of the positive and negative electrodes of the solar cell, and can avoid the risk of short circuit between electrodes with different polarities. Similarly, the first edge grid line 151 and the second edge grid line 152 are arranged in a misaligned manner along the first direction X to avoid the short circuit between different secondary electrodes.

In the solar cell provided in the embodiments of the disclosure, the main electrode 110 includes connection pads 113 and the connection line 114 (for example, the first main electrode 130 includes first sub-connection pads 131 and the first connection line 132, and the second main electrode 140 includes second sub-connection pads 141 and the second connection line 142). By providing the thinner connection line 114, effective light shielding areas and resistance loss can be reduced, thereby increasing the total power of the assembly. In addition, since the connection wires 114 constituting the main grid lines (e.g., the first connection wires 132 and the second connection wires 142) are more densely distributed, more contact points between the main grid lines and the fine grid lines can be obtained, and a path of current conduction at the cracked and micro-cracked parts of the silicon wafer is more optimized, so that the loss caused by micro-cracks is greatly reduced, which is beneficial to improving the output of the production line. The first cross-sectional area of the part of the connection wire 114 between the respective connection pad 113 and the adjacent second edge 102 is larger than the second cross-sectional area of the another part of the connection wire 114 between the two adjacent connection pads 113, i.e., the width of the part of the connection wire 114 between the second edge 102 and the connection pad 113 is larger, so that the welding stress of the connection pad 113 can be relieved to form a good contact between the welding strip and the main electrode 110. In addition, the wider connection line 114 can relieve the collection pressure of the connection pad 113 and improve the carrier transmission capacity, and the wider connection line has a larger transmission area for collecting current. Furthermore, each first connection wire 132 is in contact with a side of each of the at least one first sub-connection pad 131 close to the first edge 101, i.e., the first connection wire 132 is closer to the first edge 101, and the ability of the first connection wire 132 to collect the current at the first edge 101 is enhanced. In addition, at least one width of the first connection wire 132 is separated between the first sub-connection pad 131 and the first edge 101, so that the breakage caused by poor stress at the edge can be avoided during welding and laminating.

Furthermore, the first pitch m between the first main electrode 130 and the adjacent second main electrode 140 is not equal to the second pitch n between the adjacent second main electrodes 140. In one example, the first pitch m is larger than the second pitch n, i.e., the first main electrode 130 is close to the first edge 101. The main electrodes at the edges are sparsely arranged, so that the risk of microcracking and the like of the solar cell can be avoided during welding and laminating. In another example, the first pitch m is less than the second pitch n, which may ensure that the first main electrodes 130 at the edges and the second main electrodes 140 are densely arranged and a path of current from the secondary electrode 120 to the main electrode is shorter, thereby reducing loss and facilitating the ability of the electrodes to collect current at the edges.

Figure 16:
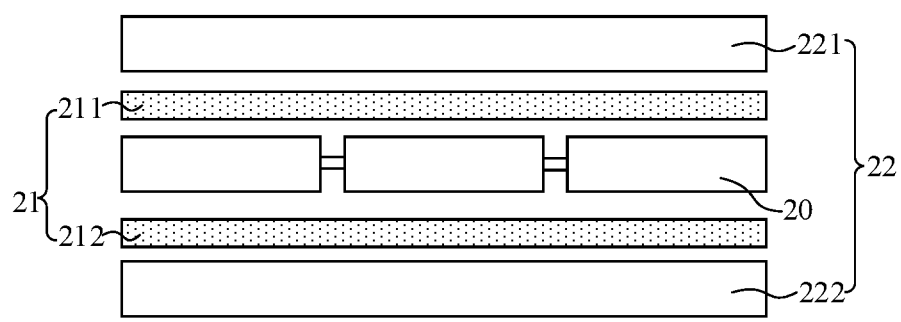
FIG. 16 is a schematic structural view of a photovoltaic module according to embodiments of the disclosure.

FIG. 16 is a schematic structural view of a photovoltaic module according to embodiments of the disclosure.

Embodiments of the disclosure further provide a photovoltaic module. As illustrated in FIG. 16, the photovoltaic module includes one or more cell strings. Each cell string is formed by connecting a plurality of solar cells 20. Each of the plurality of solar cells 20 is a solar cell provided in the above embodiments. The photovoltaic module further includes at least one encapsulating layer 21 and at least one cover plate 22. Each encapsulating layer 21 is configured to cover a surface of each of the at least one cell string. Each cover plate 22 is configured to cover a surface of a corresponding encapsulating layer 21 of the at least one encapsulating layer 21 facing away from the at least one cell string. The solar cells 20 are electrically connected in the form of a whole piece or multiple pieces to form a plurality of cell strings, and the plurality of cell strings are electrically connected in series and/or parallel.

In some embodiments, the plurality of solar cells can be electrically connected through a conductive stripe. The at least one encapsulation layer 21 includes a first encapsulation layer 211 and a second encapsulation layer 212. The first encapsulation layer 211 is configured to cover one of the front surface and the back surface of the solar cell 20, and the second encapsulation layer 212 is configured to cover the other of the front surface and the back surface of the solar cell 20. Specifically, at least one of the first encapsulation layer 211 and the second encapsulation layer 212 may be an organic encapsulation adhesive film such as an ethylene-vinyl acetate copolymer (EVA) adhesive film, a polyethylene octene co-elastomer (POE) adhesive film, or a polyethylene terephthalate (PET) adhesive film. In some embodiments, the cover plate 22 may be a cover plate with a light-transmitting function, such as a glass cover plate, a plastic cover plate, or the like. Specifically, a surface of the cover plate 22 facing the encapsulation layer 21 may be an uneven surface, thereby increasing the utilization rate of the incident light. The cover plate 22 includes a first cover plate 221 and a second cover plate 222. The first cover plate 221 faces the first encapsulation layer 211 and the second cover plate 222 faces the second encapsulation layer 212.

The foregoing embodiments of the disclosure is disclosed as preferred embodiments, but the foregoing embodiments is not used to limit the claims. Any person skilled in the art can make some possible changes and modifications without departing from the concept of the disclosure. The scope of protection shall be subject to the scope defined by the claims of the disclosure.

Those skilled in the art should appreciate that the embodiments are specific embodiments for implementing the disclosure. In practice, however, various changes may be made in the forms and details of the specific embodiments without departing from the spirit and scope of the disclosure. Any person skilled in the art may make their own changes and modifications without departing from the scope of the disclosure, so the protection scope of the present disclosure shall be subject to the scope defined by the claims.

What is claimed is:

1. A solar cell, comprising:
   a substrate having first edges and second edges, wherein the first edges include two opposite edges of the substrate along a second direction and the second edges include two opposite edges of the substrate along a first direction;
   a passivation layer disposed on the substrate;
   a plurality of secondary electrodes arranged at intervals along the second direction on the substrate, wherein each of the plurality of secondary electrodes extends along the first direction, and penetrates through the passivation layer to be in contact with the substrate;
   two first main electrodes, disposed on a surface of the passivation layer, wherein each of the two first main electrodes is close to a corresponding first edge and comprises a plurality of first sub-connection pads arranged at intervals along the second direction and a first connection wire, and the first connection wire is in contact with a side of each of at least one of the plurality of first sub-connection pads close to the corresponding first edge; and
   at least two second main electrodes, where the at least two second main electrodes are disposed on the surface of the passivation layer, and are disposed between the two first main electrodes, wherein each of the at least two second main electrodes comprises a plurality of second sub-connection pads arranged at intervals along the second direction and a second connection wire, and the second connection wire is in contact with at least one of the plurality of second sub-connection pads, wherein a first pitch between a respective first main electrode and a second main electrode adjacent to the respective first main electrode is not equal to a second pitch between any two adjacent second main electrodes; and
   the solar cell is a back contact cell, and the plurality of secondary electrodes comprises first electrodes and second electrodes alternatively arranged along the second direction, wherein the at least two second main electrodes comprise first grid line structures and second grid line structures alternatively arranged; wherein each of the first grid line structures is electrically connected with the first electrodes, and each of the second grid line structures is electrically connected with the second electrodes.

2. The solar cell of claim 1, wherein in the first direction, each of at least one of the plurality of secondary electrodes is in contact with a side of a corresponding first sub-connection pad away from the corresponding first edge.

3. The solar cell of claim 1, wherein the first pitch is greater than the second pitch.

4. The solar cell of claim 1, wherein the first pitch is less than the second pitch.

5. The solar cell of claim 1, wherein a respective chamfer is provided at a junction of each first edge and a corresponding second edge, and each of the two first main electrodes is adjacent to a corresponding pair of chamfers; and
   wherein in the second direction, at least one of a first of the plurality of first sub-connection pads and a last of the plurality of first sub-connection pads is located between the corresponding pair of chamfers along the second direction.

6. The solar cell of claim 5, wherein the first connection wire includes first connection sections and a second connection section connected to the first connection sections, wherein each of the first connection sections is between one of the first of the plurality of first sub-connection pads and the last of the plurality of first sub-connection pads and the corresponding second edge in the second direction; wherein each of the first connection sections has a cross-sectional area larger than a cross-sectional area of a respective second connection section.

7. The solar cell of claim 5, wherein in the second direction, a distance between an end of the first of the plurality of first sub-connection pads close to an adjacent second edge and an edge of an adjacent chamfer facing the first sub-connection pads along the second direction is less than or equal to a grid pitch between adjacent secondary electrodes.

8. The solar cell of claim 1, wherein in the second direction, a first distance between a first of the plurality of first sub-connection pads and an adjacent second edge is greater than a second distance between a first of the plurality of second sub-connection pads and the adjacent second edge in the second direction.

9. The solar cell of claim 1, wherein an area of each of the plurality of first sub-connection pads is larger than an area of any of the plurality of second sub-connection pads.

10. The solar cell of claim 1, wherein in the first direction, for a respective secondary electrode of the plurality of secondary electrodes, a cross-sectional area of a part of the respective secondary electrode close to the first edge is larger than a cross-sectional area of another part of the respective secondary electrode away from the first edge.

11. The solar cell of claim 1, wherein the plurality of first sub-connection pads comprise two first sub-connection disks respectively close to the second edges and at least one second sub-connection disk disposed between the two first sub-connection disks; and
   a first cross-sectional area of a first part of the first connection wire between a respective first sub-connection disk and a second edge adjacent to the respective first sub-connection disk is larger than a second cross-sectional area of a second part of the first connection wire between the two first sub-connection disks.

12. The solar cell of claim 11, wherein a difference between the first cross-sectional area and the second cross-sectional area is proportional to a spacing between the respective first sub-connection disk and the second edge adjacent to the respective first sub-connection disk.

13. The solar cell of claim 11, wherein a first width of the first part of the first connection wire between the respective first sub-connection disk and the second edge adjacent to the respective first sub-connection disk is larger than a second width of the second part of the first connection wire between the two first sub-connection disks.

14. The solar cell of claim 11, wherein for a same first main electrode, a third cross-sectional area of a third part of the first connection wire between two adjacent second sub-connection disks is a smallest cross-sectional area.

15. The solar cell of claim 14, wherein a fourth cross-sectional area of a fourth part of the first connection wire between the respective first sub-connection disk and a second sub-connection disk adjacent to the respective first sub-connection disk is greater than or equal to the third cross-sectional area.

16. The solar cell of claim 14, wherein an area of each of the two first sub-connection disks is larger than an area of any of the at least one second sub-connection disk.

17. The solar cell of claim 11, wherein the first connection wire is closed at each port of ports respectively close to the second edges, and the second connection wire is closed at each port of ports respectively close to the second edges, wherein a sectional area of the first connection wire is larger than or equal to a sectional area of the second connection wire.

18. The solar cell of claim 1, wherein the first grid line structures and the second grid line structures are misaligned along the first direction.

19. A photovoltaic module, comprising:
at least one cell string each comprising a plurality of solar cells;
at least one encapsulating layer, each encapsulating layer of the at least one encapsulating layer being configured to cover a surface of each of the at least one cell string; and
at least one cover plate, each cover plate of the at least one cover plate being configured to cover a surface of a corresponding encapsulating layer of the at least one encapsulating layer facing away from the at least one cell string, wherein
each solar cell of the plurality of solar cells comprises:
a substrate having first edges and second edges, wherein the first edges include two opposite edges of the substrate along a second direction and the second edges include two opposite edges of the substrate along a first direction;
a passivation layer disposed on the substrate;
a plurality of secondary electrodes arranged at intervals along the second direction on the substrate, wherein each of the plurality of secondary electrodes extends along the first direction, and penetrates through the passivation layer to be in contact with the substrate;
two first main electrodes, disposed on a surface of the passivation layer, wherein each of the two first main electrodes is close to a corresponding first edge and comprises a plurality of first sub-connection pads arranged at intervals along the second direction and a first connection wire, and the first connection wire is in contact with a side of each of at least one of the plurality of first sub-connection pads close to the corresponding first edge; and
at least two second main electrodes, where the at least two second main electrodes are disposed on the surface of the passivation layer, and are disposed between the two first main electrodes, wherein each of the at least two second main electrodes comprises a plurality of second sub-connection pads arranged at intervals along the second direction and a second connection wire, and the second connection wire is in contact with at least one of the plurality of second sub-connection pads, wherein
a first pitch between a respective first main electrode and a second main electrode adjacent to the respective first main electrode is not equal to a second pitch between adjacent second main electrodes; and
the solar cell is a back contact cell, and the plurality of secondary electrodes comprises first electrodes and second electrodes alternatively arranged along the second direction, wherein the at least two second main electrodes comprise first grid line structures and second grid line structures alternatively arranged; wherein each of the first grid line structures is electrically connected with the first electrodes, and each of the second grid line structures is electrically connected with the second electrodes.

* * * * *